(12) United States Patent
Pacala et al.

(10) Patent No.: US 12,153,133 B2
(45) Date of Patent: Nov. 26, 2024

(54) INDEPENDENT PER-PIXEL INTEGRATION REGISTERS FOR LIDAR MEASUREMENTS

(71) Applicant: Ouster, Inc., San Francisco, CA (US)

(72) Inventors: Angus Pacala, San Francisco, CA (US); Marvin Liu Shu, San Francisco, CA (US)

(73) Assignee: Ouster, Inc., San Francisco, CA (US)

( * ) Notice: Subject to any disclaimer, the term of this patent is extended or adjusted under 35 U.S.C. 154(b) by 1615 days.

(21) Appl. No.: 16/396,564

(22) Filed: Apr. 26, 2019

(65) Prior Publication Data
US 2020/0341144 A1    Oct. 29, 2020

(51) Int. Cl.
| | |
|---|---|
| G01S 17/10 | (2020.01) |
| G01S 7/481 | (2006.01) |
| G01S 7/484 | (2006.01) |
| G01S 7/486 | (2020.01) |
| G01S 17/88 | (2006.01) |
| H03K 3/027 | (2006.01) |
| H04B 1/04 | (2006.01) |

(52) U.S. Cl.
CPC .............. *G01S 17/10* (2013.01); *G01S 7/4811* (2013.01); *G01S 7/484* (2013.01); *G01S 7/486* (2013.01); *G01S 17/88* (2013.01); *H03K 3/027* (2013.01); *H04B 1/04* (2013.01)

(58) Field of Classification Search
CPC ....... G01S 7/4865; G01S 7/4811; G01S 17/10
See application file for complete search history.

(56) References Cited

U.S. PATENT DOCUMENTS

| | | | |
|---|---|---|---|
| 3,566,402 A | 2/1971 | Taylor | |
| 3,786,428 A | 1/1974 | Takashi | |
| 7,020,353 B1 | 3/2006 | Mccaffrey et al. | |
| 7,187,452 B2 | 3/2007 | Jupp et al. | |
| 7,456,970 B1 | 11/2008 | Lopez et al. | |

(Continued)

FOREIGN PATENT DOCUMENTS

| | | |
|---|---|---|
| CN | 205826866 | 12/2016 |
| GB | 1291240 A | 10/1972 |

(Continued)

OTHER PUBLICATIONS

Sarmad et al., "Developing LIDAR Pulse Code Detection System Using PRF", 2013 American Control Conference 16, 2013, pp. 307-312.

(Continued)

*Primary Examiner* — Lam S Nguyen
(74) *Attorney, Agent, or Firm* — Kilpatrick Townsend & Stockton LLP

(57) ABSTRACT

An optical measurement system includes a photosensor that includes one or more photosensitive elements. Each of the photosensitive elements may generate signals when a photon is detected, and the number of photons detected for each photosensor may be accumulated in an integration register. The integration register may accumulate photon counts independent of a parallel data path that stores photon counts in time bins based on photon arrival times to form a histogram representation. The total photon count in the integration register can be used to estimate ambient background light and properly set signal thresholds for detecting reflected light signals represented in the histogram.

21 Claims, 19 Drawing Sheets

(56) References Cited

U.S. PATENT DOCUMENTS

| | | |
|---|---|---|
| 7,830,442 B2 | 11/2010 | Griffis et al. |
| 7,917,320 B2 | 3/2011 | Levesque et al. |
| 7,969,558 B2 | 6/2011 | Hall |
| 8,115,925 B1 | 2/2012 | Mathur et al. |
| 8,232,514 B2 | 7/2012 | Grund |
| 8,363,511 B2 | 1/2013 | Frank et al. |
| 8,374,405 B2 | 2/2013 | Lee et al. |
| 8,675,181 B2 | 3/2014 | Hall |
| 8,724,096 B2 | 5/2014 | Gosch et al. |
| 8,767,190 B2 | 7/2014 | Hall |
| 8,836,922 B1 | 9/2014 | Pennecot et al. |
| 8,963,069 B2 | 2/2015 | Drader et al. |
| 9,081,096 B2 | 7/2015 | Li |
| 9,285,464 B2 | 3/2016 | Pennecot et al. |
| 9,551,791 B2 | 1/2017 | Van Den Bossche et al. |
| 9,882,433 B2 | 1/2018 | Lenius et al. |
| 9,935,514 B1 | 4/2018 | Lenius |
| 9,989,406 B2 | 6/2018 | Pacala et al. |
| 9,992,477 B2 | 6/2018 | Pacala et al. |
| 10,036,801 B2 | 7/2018 | Retterath et al. |
| 10,048,374 B2 | 8/2018 | Hall |
| 10,063,849 B2 | 8/2018 | Pacala et al. |
| 10,183,541 B2 | 1/2019 | Van Den Bossche et al. |
| 10,203,399 B2 | 2/2019 | Retterath et al. |
| 10,222,458 B2 | 3/2019 | Pacala et al. |
| 10,222,475 B2 | 3/2019 | Pacala et al. |
| 10,291,319 B1 | 5/2019 | Karplus et al. |
| 10,317,529 B2 | 6/2019 | Shu et al. |
| 10,884,126 B2 | 1/2021 | Shu et al. |
| 2004/0119838 A1 | 6/2004 | Griffis et al. |
| 2004/0130702 A1 | 7/2004 | Jupp et al. |
| 2009/0099813 A1 | 4/2009 | Dimsdale et al. |
| 2010/0020306 A1 | 1/2010 | Hall |
| 2010/0027602 A1 | 2/2010 | Abshire et al. |
| 2010/0042362 A1 | 2/2010 | Levesque et al. |
| 2010/0114416 A1 | 5/2010 | Au et al. |
| 2010/0182874 A1 | 7/2010 | Frank et al. |
| 2011/0052004 A1 | 3/2011 | Lee et al. |
| 2011/0153268 A1 | 6/2011 | Jordan et al. |
| 2012/0026497 A1 | 2/2012 | Mathur et al. |
| 2012/0091324 A1 | 4/2012 | Grund |
| 2012/0154786 A1 | 6/2012 | Gosch et al. |
| 2013/0153754 A1 | 6/2013 | Drader et al. |
| 2014/0063483 A1 | 3/2014 | Li |
| 2014/0211194 A1 | 7/2014 | Pacala et al. |
| 2015/0041625 A1 | 2/2015 | Dutton et al. |
| 2015/0131080 A1 | 5/2015 | Retterath et al. |
| 2016/0041258 A1 | 2/2016 | Cashler et al. |
| 2016/0259038 A1 | 9/2016 | Retterath et al. |
| 2017/0052065 A1 | 2/2017 | Sharma et al. |
| 2017/0146640 A1 | 5/2017 | Hall et al. |
| 2017/0219695 A1 | 8/2017 | Hall et al. |
| 2017/0269197 A1 | 9/2017 | Hall et al. |
| 2017/0269198 A1 | 9/2017 | Hall et al. |
| 2017/0269209 A1 | 9/2017 | Hall et al. |
| 2017/0269215 A1 | 9/2017 | Hall et al. |
| 2017/0350983 A1 | 12/2017 | Hall et al. |
| 2018/0081041 A1 | 3/2018 | Niclass et al. |
| 2018/0109061 A1 | 4/2018 | Pardhan et al. |
| 2018/0118041 A1 | 5/2018 | Lenius et al. |
| 2018/0123412 A1 | 5/2018 | Karplus et al. |
| 2018/0259645 A1* | 9/2018 | Shu ................. G01S 7/4865 |
| 2018/0284277 A1 | 10/2018 | LaChappelle et al. |
| 2018/0292534 A1 | 10/2018 | Field |
| 2018/0299552 A1 | 10/2018 | Shu et al. |
| 2018/0299554 A1 | 10/2018 | Van Dyck et al. |
| 2018/0321360 A1 | 11/2018 | Hall et al. |
| 2018/0373260 A1 | 12/2018 | Lipson et al. |
| 2019/0018119 A1 | 1/2019 | Laifenfeld et al. |
| 2019/0041502 A1 | 2/2019 | Onal et al. |
| 2019/0056497 A1 | 2/2019 | Pacala et al. |
| 2019/0257950 A1 | 8/2019 | Patanwala et al. |

FOREIGN PATENT DOCUMENTS

| | | |
|---|---|---|
| WO | 2016063028 | 4/2016 |
| WO | 2016126250 A1 | 8/2016 |
| WO | 2017132704 A1 | 8/2017 |
| WO | 2018057081 A1 | 3/2018 |
| WO | 2018065427 A1 | 4/2018 |
| WO | 2018065428 A2 | 4/2018 |
| WO | 2018065429 A1 | 4/2018 |
| WO | 2019055979 A1 | 3/2019 |

OTHER PUBLICATIONS

International Searching Authority; International Search Report and The Written Opinion of the International Searching Authority, received in PCT/US2018/20525; mailed Jul. 3, 2018; 32 pages.

\* cited by examiner

INDEPENDENT PER-PIXEL INTEGRATION REGISTERS FOR LIDAR MEASUREMENTS

BACKGROUND

Light Detection And Ranging (LIDAR) systems are used for object detection and ranging, e.g., for vehicles such as cars, trucks, boats, etc. LIDAR systems also have uses in mobile applications (e.g., for face recognition), home entertainment (e.g., to capture gesture capture for video game input), and augmented reality. A LIDAR system measures the distance to an object by irradiating a landscape with pulses from a laser, and then measuring the time for photons to travel to an object and return after reflection, as measured by a receiver of the LIDAR system. A detected signal is analyzed to detect the presence of reflected signal pulses among background light. A distance to an object can be determined based on a time-of-flight from transmission of a pulse to reception of a corresponding reflected pulse.

It can be difficult to provide robust distance accuracy down to a few centimeters in all conditions, particularly at an economical cost for the LIDAR system. Promising new detector technologies, like single photon avalanche diodes (SPADs), are attractive but have significant drawbacks when used to measure time-of-flight and other signal characteristics due to their limited dynamic range, particularly over a broad range of ambient conditions and target distances. Additionally, because of their sensitivity to even a small number of photons, SPADs can be very susceptible to ambient levels of background noise light.

LIDAR systems would benefit from more accurate methods of detecting reflected laser pulses and measuring their time-of-flight under varying real world conditions. Specifically, SPAD-based LIDAR systems would benefit from methods to accurately estimate a background noise level and aggregate total photon counts over the course of a measurement.

SUMMARY

An optical measurement system may include a photosensor that includes one or more photosensitive elements. Each of the photosensitive elements may generate signals when a photon is detected, and the number of photons detected for each photosensor may be accumulated in an integration register. The integration register may accumulate photon counts independent of a parallel data path that stores photon counts in time bins based on photon arrival times to form a histogram representation. The total photon count in the integration register can be used to estimate ambient background light and properly set signal thresholds for detecting reflected light signals represented in the histogram.

In some embodiments a method of using an optical measurement system may include transmitting N pulse trains from a light source over a plurality of time intervals as part of an optical measurement, where each of the N pulse trains (N being an integer greater than or equal to one) includes one or more pulses from the light source and corresponds to a different time interval that is triggered by a start signal. The method may also include detecting photons of the N pulse trains and photons from ambient light using one or more photodetectors of a photosensor of the optical measurement system. This may generate a plurality of signals over the plurality of time intervals for each of the one or more photodetectors, where a signal from a photodetector indicates whether a photon was detected during a time bin of a time interval. During each of a plurality of time bins in each of the plurality of time intervals, The method may additionally include receiving, at an arithmetic logic circuit, a set of signals from the one or more photodetectors, aggregating a number of positive signals in the set of signals that indicate a detection of a photon to generate a total signal count for the time bin, and aggregating the total signal counts in an integration register to obtain a total photon count for the photosensor. The total photon count may represent a total number of positive signals received from the one or more photodetectors across at least the plurality of time bins in the plurality of time intervals.

In any embodiment, any of the following features may be implemented in any combination and without limitation. The method may also include using the total photon count in the integration register to estimate a background noise detected by the optical measurement system. Using the total photon count in the integration register to estimate a background noise may include dividing the total photon count by a duration of time during which the integration register was enabled. The duration of time during which the integration register was enabled may be determined based on a total number of the plurality of time bins or a total number of clock cycles during which the integration register was enabled. Using the total photon count in the integration register to estimate a background noise may include identifying one or more time bins in the plurality of time bins during which reflected signals resulting from the N pulse trains are estimated to have been received by the optical measurement system, and excluding signals in the plurality of signals received during the one or more time bins from the total photon count in the integration register. The method may further include removing the background noise from the reflected signals. Removing the background noise from the reflected signals may include subtracting the background noise from the signals received during the one or more time bins. The method may also include determining a threshold for detecting signals as corresponding to a reflection of pulses of the N pulse trains from an object, such that the threshold is higher than the background noise. Determining the threshold for detecting the reflected signals may include multiplying the background noise by a predetermined percentage to calculate the threshold. Each of the plurality of time bins may recur in each of the plurality of time intervals, and the method may also include, for each of the plurality of time bins, aggregating the total signal counts across the plurality of time intervals to obtain a total bin count for the time bin, and storing the total bin count in a memory that represents a histogram, where each of the total bin counts is stored in an individual location in the memory. The integration register may be clocked independently from the memory that represents the histogram. The one or more photodetectors may include single-photon avalanche diodes (SPADs).

In some embodiments an optical measurement system may include a light source configured to transmit N pulse trains (N being an integer greater than or equal to one) over a plurality of time intervals as part of an optical measurement, where each of the N pulse trains may include one or more pulses from the light source and corresponds to a different time interval that is triggered by a start signal. The optical measurement system may also include a photosensor including one or more photodetectors configured to detect photons of the N pulse trains and photons from ambient light and to generate a plurality of signals over the plurality of time intervals for each of the one or more photodetectors, where a signal from a photodetector may indicate whether a photon was detected during a time bin of a time interval. The optical measurement system may additionally include an arithmetic logic circuit configured to receive, for each of a plurality of time bins in each of the plurality of time intervals, a set of signals from the one or more photodetectors and to aggregate a number of positive signals in the set of signals that indicate a detection of a photon, thereby generating a total signal count for the time bin. The optical measurement system may further include an integration register configured to store an aggregation of the total signal counts to obtain a total photon count for the photosensor, such that the total photon count represents a total number of positive signals received from the one or more photodetectors across at least the plurality of time bins in the plurality of time intervals.

In any embodiment, any of the following features may be implemented in any combination and without limitation. The plurality of signals from the one or more photodetectors may include binary signals. The optical measurement system may also include a periodic signal that causes the arithmetic logic circuit to aggregate the signals received during each of the plurality of time bins. The optical measurement system may also include a memory that represents a histogram of respective photon counts for each of the plurality of time bins across the plurality of time intervals. The periodic signal may be shared between the memory and the integration register. The integration register may be clocked using the periodic signal, and the memory that represents a histogram may be clocked using a different periodic signal. The arithmetic logic circuit and the integration register may be part of a single integrated circuit. The arithmetic logic circuit may also include a first stage configured to aggregate, for each of a plurality of time bins in the plurality of time intervals, the number of positive signals in the set of signals received for the time bin; and a second stage configured to aggregate the total signal counts for each of the plurality of time bins in each of the plurality of time intervals. The first stage of the arithmetic logic circuit may be shared between the integration register and a memory that represents a histogram of respective photon counts for each of the plurality of time bins across the plurality of time intervals. The optical measurement system may also include a plurality of photosensors that each correspond to different fields of view, where each of the plurality of photosensors may include a plurality of photodetectors, an arithmetic logic circuit, and an integration register.

In some embodiments an optical measurement system may include one or more photosensitive elements, and a first register that accumulates photon counts from the one or more photosensitive elements during one or more first time intervals defined by a first enable signal. The optical measurement system may also include a plurality of second registers that accumulates the photon counts from the one or more photosensitive elements into the plurality of second registers based on arrival times of photons within one or more second time intervals defined by a second enable signal. The second enable signal may be independent from the first enable signal. Each triggering of the second enable signal may accumulate the photon counts into a respective one of the plurality of second registers to represent a histogram of photon counts across time bins in the one or more second time intervals.

In any embodiment, any of the following features may be implemented in any combination and without limitation. The one or more photosensitive elements may include one or more SPADs. Each triggering of the second enable signal may be associated with one or more pulse trains emitted from a light source as part of an optical measurement. The photon count in the first register may be used to estimate a background noise detected by the optical measurement system. The first time interval may include more than one of the one or more second time intervals. There may be a non-zero time interval between at least two consecutive time intervals in the one or more second time intervals. Each triggering of the second enable signal may represent a start signal for a single accumulation of photon counts in each of the plurality of second registers. The first register may continue to accumulate photon counts after the one or more second time intervals are over.

These and other embodiments of the invention are described in detail below. For example, other embodiments are directed to systems, devices, and computer readable media associated with methods described herein.

A better understanding of the nature and advantages of embodiments of the present invention may be gained with reference to the following detailed description and the accompanying drawings.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, it is intended to refer to all such multiple similar components.

TERMS

Figure 1B:
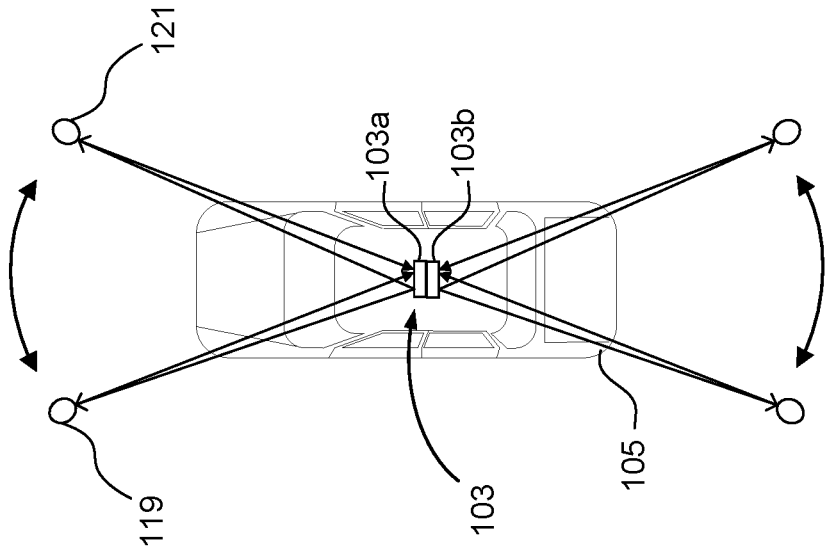
FIGS. 1A and 1B show automotive light ranging devices, also referred to herein as LIDAR systems, according to some embodiments.

The term "ranging," particularly when used in the context of methods and devices for measuring an environment or assisting with vehicle operations, may refer to determining a distance or a distance vector from one location or position to another location or position. "Light ranging" may refer to a type of ranging method that makes use of electromagnetic waves to perform ranging methods or functions. Accordingly, a "light ranging device" may refer to a device for performing light ranging methods or functions. "Lidar" or "LIDAR" may refer to a type of light ranging method that measures a distance to a target by illuminating the target with a pulsed laser light, and thereafter measure the reflected pulses with a sensor. Accordingly, a "lidar device" or "lidar system" may refer to a type of light ranging device for performing lidar methods or functions. A "light ranging system" may refer to a system comprising at least one light ranging device, e.g., a lidar device. The system may further comprise one or more other devices or components in various arrangements.

A "pulse train" may refer to one or more pulses that are transmitted together. The emission and detection of a pulse train may be referred to as a "shot." A shot can occur over a "detection time interval" (or "detection interval").

A "measurement" may include N multiple pulse trains that are emitted and detected over N shots, each lasting a detection time interval. An entire measurement can be over a measurement time interval (or just "measurement interval"), which may equal the N detection interval of a measurement or be longer, e.g., when pauses occur between detection intervals.

A "photosensor" or "photosensitive element" can convert light into an electrical signal. A photosensor may include a plurality of "photodetectors," e.g., single-photon avalanche diodes (SPADs). A photosensor can correspond to a particular pixel of resolution in a ranging measurement.

A "histogram" may refer to any data structure representing a series of values over time, as discretized over time bins. A histogram can have a value assigned to each time bin. For example, a histogram can store a counter of a number of photodetectors that fired during a particular time bin in each of one or more detection intervals. As another example, a histogram can correspond to the digitization of an analog signal at different times. A histogram can include signal (e.g., pulses) and noise. Thus, a histogram can be considered a combination of signal and noise as a photon time series or photon flux. A raw/digitized histogram (or accumulated photon time series) can contain the signal and the noise as digitized in memory without filtering. A "filtered histogram" may refer to the output after the raw histogram is passed through a filter.

An emitted signal/pulse may refer to the "nominal," "ideal," or "template" pulse or pulse train that is not distorted. A reflected signal/pulse may refer to the reflected laser pulse from an object and may be distorted. A digitized signal/pulse (or raw signal) may refer to the digitized result from the detection of one or more pulse trains of a detection interval as stored in memory, and thus may be equivalent to a portion of a histogram. A detected signal/pulse may refer to the location in memory that the signal was detected. A detected pulse train may refer to the actual pulse train found by a matched filter. An anticipated signal profile may refer to a shape of a digitized signal resulting from a particular emitted signal that has a particular distortion in the reflected signal.

DETAILED DESCRIPTION

The present disclosure relates generally to the field of object detection and ranging, and more particularly to the use of time-of-flight optical receiver systems for applications such as real-time three-dimensional mapping and object detection, tracking and/or classification. Various improvements can be realized with various embodiments of the present invention. Such improvements can be increased accuracy, reduced noise, and increased energy efficiency.

An optical measurement system may include a photosensor that includes one or more photosensitive elements. Each of the photosensitive elements may generate signals when a photon is detected, and the number of photons detected for each photosensor may be accumulated in an integration register. The integration register may accumulate photon counts independent of a parallel data path that stores photon counts in time bins based on photon arrival times to form a histogram representation. The total photon count in the integration register can be used to estimate ambient background light and properly set signal thresholds for detecting reflected light signals represented in the histogram.

Sections below introduce an illustrative automotive LIDAR system, followed descriptions of example techniques to detect signals by a light ranging system, and then different embodiments are described in more details.

I. Illustrative Automotive Lidar System

Figure 1A:
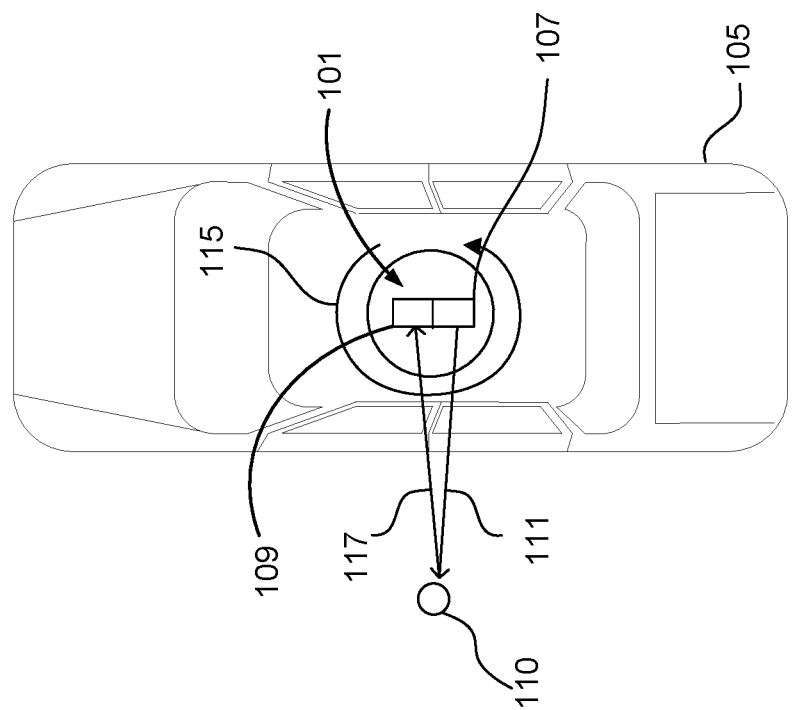

FIGS. 1A-1B show automotive light ranging devices, also referred to herein as LIDAR systems, according to some embodiments. The automotive application for the LIDAR systems is chosen here merely for the sake of illustration and the sensors described herein may be employed in other types of vehicles, e.g., boats, aircraft, trains, etc., as well as in a variety of other applications where 3D depth images are useful, such as medical imaging, mobile phones, augmented reality, geodesy, geomatics, archaeology, geography, geology, geomorphology, seismology, forestry, atmospheric physics, laser guidance, airborne laser swath mapping (ALSM), and laser altimetry. According to some embodiments, a LIDAR system, e.g., scanning LIDAR system 101 and/or solid state LIDAR system 103, can be mounted on the roof of a vehicle 105 as shown in FIGS. 1A and 1B.

The scanning LIDAR system 101 shown in FIG. 1A can employ a scanning architecture, where the orientation of the LIDAR light source 107 and/or detector circuitry 109 can be scanned around one or more fields of view 110 within an external field or scene that is external to the vehicle 105. In the case of the scanning architecture, the emitted light 111 can be scanned over the surrounding environment as shown. For example, the output beam(s) of one or more light sources (such as infrared or near-infrared pulsed IR lasers, not shown) located in the LIDAR system 101, can be scanned, e.g., rotated, to illuminate a scene around the vehicle. In some embodiments, the scanning, represented by rotation arrow 115, can be implemented by mechanical means, e.g., by mounting the light emitters to a rotating column or platform. In some embodiments, the scanning can be implemented through other mechanical means such as through the use of galvanometers. Chip-based steering techniques can also be employed, e.g., by using microchips that employ one or more MEMS based reflectors, e.g., such as a digital micromirror (DMD) device, a digital light processing (DLP) device, and the like. In some embodiments, the scanning can be effectuated through non-mechanical means, e.g., by using electronic signals to steer one or more optical phased arrays.

For a stationary architecture, like solid state LIDAR system 103 shown in FIG. 1B, one or more solid state LIDAR subsystems (e.g., 103a and 103b) can be mounted to the vehicle 105. Each solid state LIDAR unit can face a different direction (possibly with partially and/or non-overlapping fields of views between units) so as to capture a composite field of view that is larger than each unit is capable of capturing on its own.

In either the scanning or stationary architectures, objects within the scene can reflect portions of the light pulses that are emitted from the LIDAR light sources. One or more reflected portions then travel back to the LIDAR system and can be detected by the detector circuitry. For example, reflected portion 117 can be detected by detector circuitry 109. The detector circuitry can be disposed in the same housing as the emitters. Aspects of the scanning system and stationary system are not mutually exclusive and thus can be used in combination. For example, the individual LIDAR subsystems 103a and 103b in FIG. 1B can employ steerable emitters such as an optical phased array or whole the composite unit may rotate through mechanical means thereby scanning the entire scene in front of the LIDAR system, e.g., from field of view 119 to field of view 121.

Figure 2:
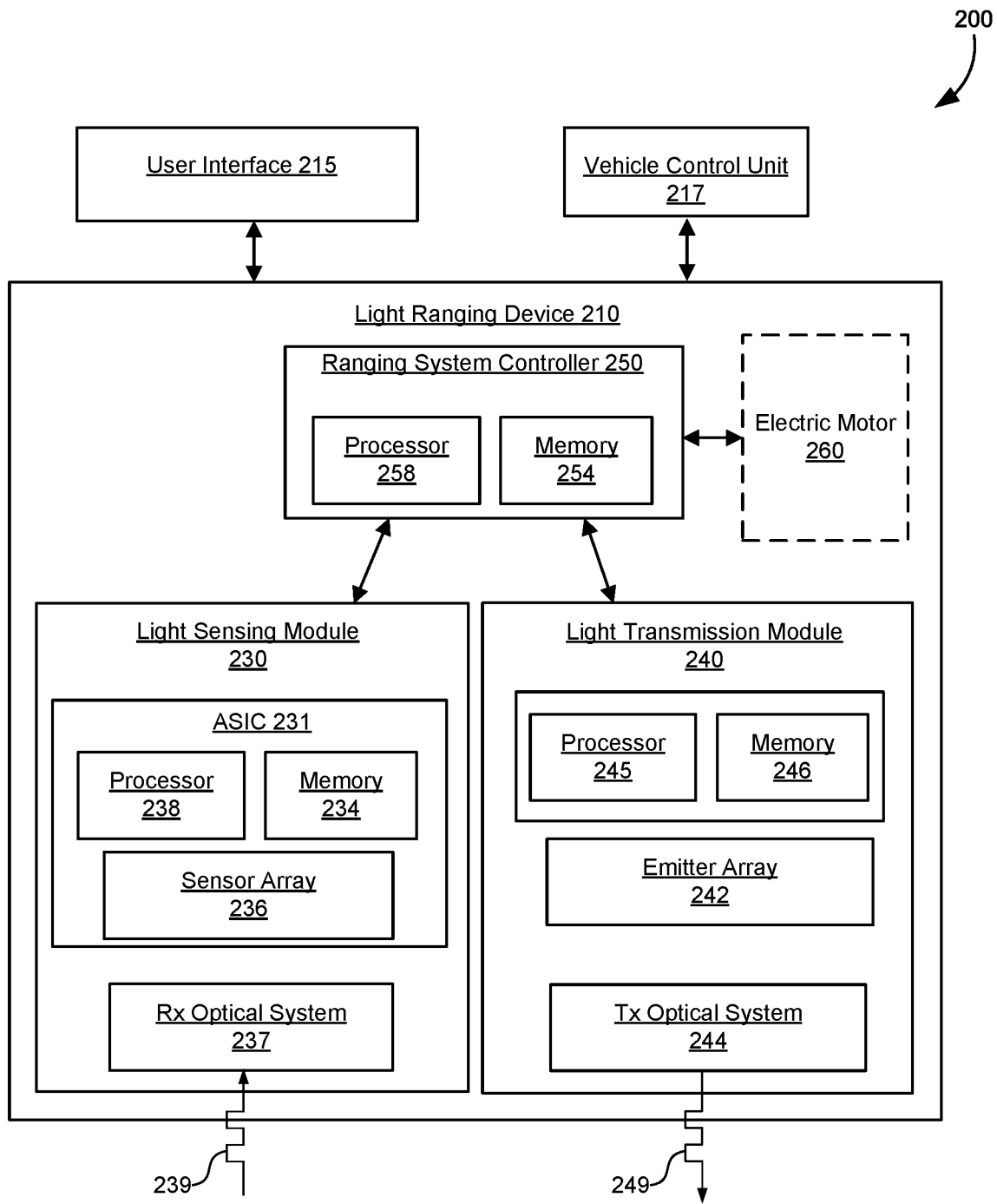
FIG. 2 shows a block diagram of an exemplary LIDAR device for implementing various embodiments.

FIG. 2 illustrates a more detailed block diagram of a rotating LIDAR system 200 according to some embodiments. More specifically, FIG. 2 optionally illustrates a rotating LIDAR system that can employ a rotary actuator on a rotating circuit board, which can receives power and data (as well as transmit) from a stationary circuit board.

LIDAR system 200 can interact with one or more instantiations of user interface 215. The different instantiations of user interface 215 can vary and may include, e.g., a computer system with a monitor, keyboard, mouse, CPU and memory; a touch-screen in an automobile; a handheld device with a touch-screen; or any other appropriate user interface. The user interface 215 may be local to the object upon which the LIDAR system 200 is mounted but can also be a remotely operated system. For example, commands and data to/from the LIDAR system 200 can be routed through a cellular network (LTE, etc.), a personal area network (Bluetooth, Zigbee, etc.), a local area network (WiFi, IR, etc.), or a wide area network such as the Internet.

The user interface 215 of hardware and software can present the LIDAR data from the device to the user but can also allow a user to control the LIDAR system 200 with one or more commands. Example commands can include commands that activate or deactivate the LIDAR system, specify photo-detector exposure level, bias, sampling duration and other operational parameters (e.g., emitted pulse patterns and signal processing), specify light emitters parameters such as brightness. In addition, commands can allow the user to select the method for displaying results. The user interface can display LIDAR system results which can include, e.g., a single frame snapshot image, a constantly updated video image, and/or a display of other light measurements for some or all pixels. In some embodiments, user interface 215 can track distances (proximity) of objects from the vehicle, and potentially provide alerts to a driver or provide such tracking information for analytics of a driver's performance.

In some embodiments, the LIDAR system can communicate with a vehicle control unit 217 and one or more parameters associated with control of a vehicle can be modified based on the received LIDAR data. For example, in a fully autonomous vehicle, the LIDAR system can provide a real time 3D image of the environment surrounding the car to aid in navigation. In other cases, the LIDAR system can be employed as part of an advanced driver-assistance system (ADAS) or as part of a safety system that, e.g., can provide 3D image data to any number of different systems, e.g., adaptive cruise control, automatic parking, driver drowsiness monitoring, blind spot monitoring, collision avoidance systems, etc. When a vehicle control unit 217 is communicably coupled to light ranging device 210, alerts can be provided to a driver or tracking of a proximity of an object can be tracked.

The LIDAR system 200 shown in FIG. 2 includes the light ranging device 210. The light ranging device 210 includes a ranging system controller 250, a light transmission (Tx) module 240 and a light sensing (Rx) module 230. Ranging data can be generated by the light ranging device by transmitting one or more light pulses 249 from the light transmission module 240 to objects in a field of view surrounding the light ranging device. Reflected portions 239 of the transmitted light are then detected by the light sensing module 230 after some delay time. Based on the delay time, the distance to the reflecting surface can be determined. Other ranging methods can be employed as well, e.g. continuous wave, Doppler, and the like.

The Tx module 240 includes an emitter array 242, which can be a one-dimensional or two-dimensional array of emitters, and a Tx optical system 244, which when taken together can form an array of micro-optic emitter channels. Emitter array 242 or the individual emitters are examples of laser sources. The Tx module 240 further includes processor 245 and memory 246. In some embodiments, a pulse coding technique can be used, e.g., Barker codes and the like. In such cases, memory 246 can store pulse-codes that indicate when light should be transmitted. In one embodiment the pulse-codes are stored as a sequence of integers stored in memory.

The Rx module 230 can include sensor array 236, which can be, e.g., a one-dimensional or two-dimensional array of photosensors. Each photosensor or photosensitive element (also referred to as a sensor) can include a collection of photodetectors, e.g., APDs or the like, or a sensor can be a single photon detector (e.g., an SPAD). Like the Tx module 240, Rx module 230 includes an Rx optical system 237. The Rx optical system 237 and sensor array 236 taken together can form an array of micro-optic receiver channels. Each micro-optic receiver channel measures light that corresponds to an image pixel in a distinct field of view of the surrounding volume. Each sensor (e.g., a collection of SPADs) of sensor array 236 can correspond to a particular emitter of emitter array 242, e.g., as a result of a geometrical configuration of light sensing module 230 and light transmission module 240.

In one embodiment, the sensor array 236 of the Rx module 230 is fabricated as part of a monolithic device on a single substrate (using, e.g., CMOS technology) that includes both an array of photon detectors and an ASIC 231 for signal processing the raw histograms from the individual photon detectors (or groups of detectors) in the array. As an example of signal processing, for each photon detector or grouping of photon detectors, memory 234 (e.g., SRAM) of the ASIC 231 can accumulate counts of detected photons over successive time bins, and these time bins taken together can be used to recreate a time series of the reflected light pulse (i.e., a count of photons vs. time). This time-series of aggregated photon counts is referred to herein as an intensity histogram (or just histogram). The ASIC 231 can implement matched filters and peak detection processing to identify return signals in time. In addition, the ASIC 231 can accomplish certain signal processing techniques (e.g., by processor 238), such as multi-profile matched filtering to help recover a photon time series that is less susceptible to pulse shape distortion that can occur due to SPAD saturation and quenching. In some embodiments, all or parts of such filtering can be performed by processor 258, which may be embodied in an FPGA.

In some embodiments, the Rx optical system 237 can also be part of the same monolithic structure as the ASIC, with separate substrate layers for each receiver channel layer. For example, an aperture layer, collimating lens layer, an optical filter layer and a photo-detector layer can be stacked and bonded at the wafer level before dicing. The aperture layer can be formed by laying a non-transparent substrate on top of a transparent substrate or by coating a transparent substrate with an opaque film. In yet other embodiments, one or more components of the Rx module 230 may be external to the monolithic structure. For example, the aperture layer may be implemented as a separate metal sheet with pinholes.

In some embodiments, the photon time series output from the ASIC are sent to the ranging system controller 250 for further processing, e.g., the data can be encoded by one or more encoders of the ranging system controller 250 and then sent as data packets to user interface 215. The ranging system controller 250 can be realized in multiple ways including, e.g., by using a programmable logic device such an FPGA, as an ASIC or part of an ASIC, using a processor 258 with memory 254, and some combination of the above. The ranging system controller 250 can cooperate with a stationary base controller or operate independently of the base controller (via pre-programed instructions) to control the light sensing module 230 by sending commands that include start and stop light detection and adjust photodetector parameters. Similarly, the ranging system controller 250 can control the light transmission module 240 by sending commands, or relaying commands from the base controller, that include start and stop light emission controls and controls that can adjust other light-emitter parameters (e.g., pulse codes). In some embodiments, the ranging system controller 250 has one or more wired interfaces or connectors for exchanging data with the light sensing module 230 and with the light transmission module 240. In other embodiments, the ranging system controller 250 communicates with the light sensing module 230 and light transmission module 240 over a wireless interconnect such as an optical communication link.

The electric motor 260 may be an optional component needed when system components, e.g., the Tx module 240 and or Rx module 230, need to rotate. The system controller 250 controls the electric motor 260 and can start rotation, stop rotation and vary the rotation speed.

II. Detection of Reflected Pulses

The photosensors can be arranged in a variety of ways for detecting reflected pulses. For example, the photosensors can be arranged in an array, and each photosensor can include an array of photodetectors (e.g., SPADs). Different patterns of pulses (pulse trains) transmitted during a detection interval are also described below.

A. Time-of-Flight Measurements and Detectors

Figure 3:
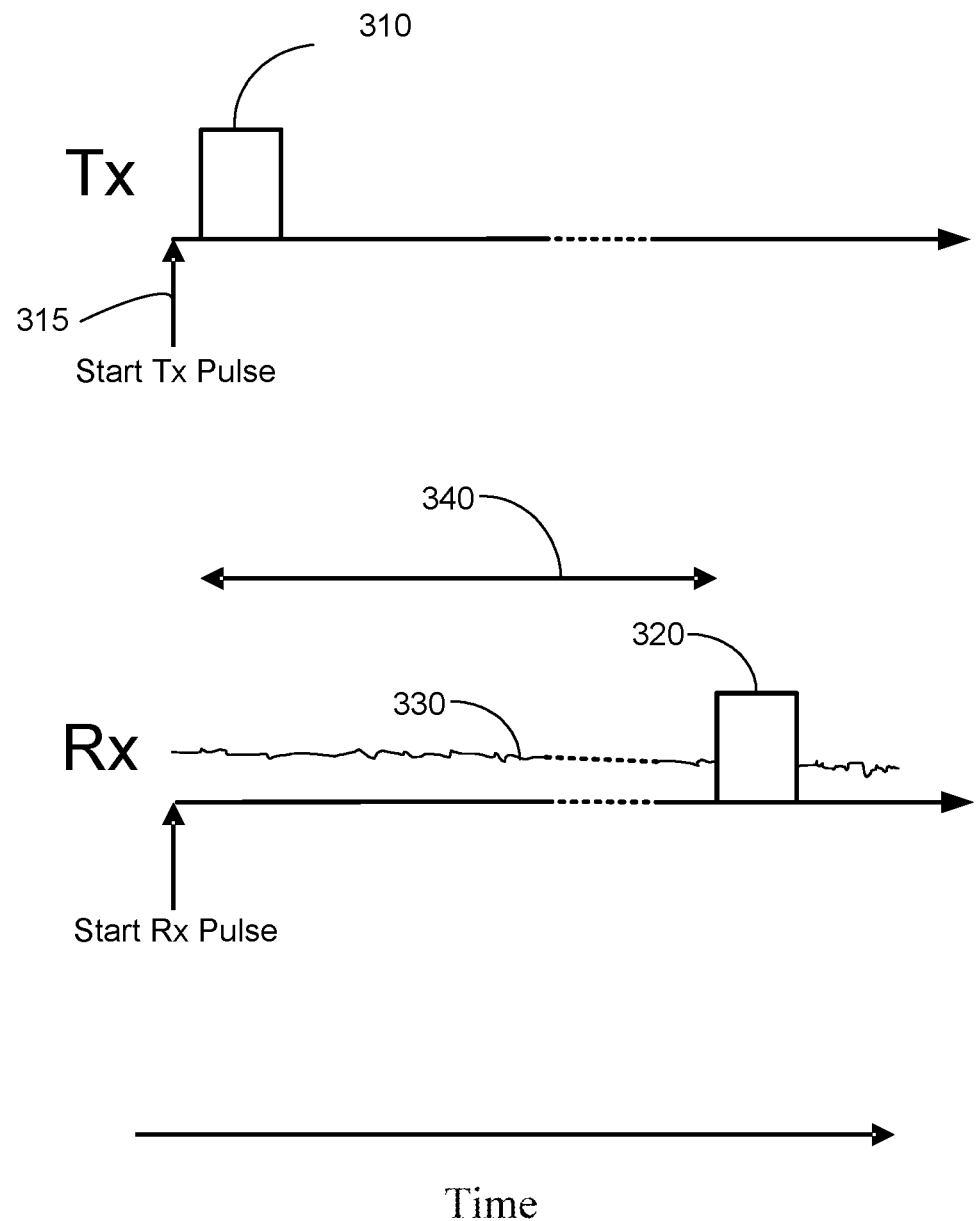
FIG. 3 illustrates the operation of a typical LIDAR system that may be improved by embodiments.

FIG. 3 illustrates the operation of a typical LIDAR system that may be improved by some embodiments. A laser generates a light pulse 310 of short duration. The horizontal axis represents time and the vertical axis represents power. An example laser pulse duration, characterized by the full-width half maximum (FWHM), is a few nanoseconds, with the peak power of a single emitter being around a few watts. Embodiments that use side emitter lasers or fiber lasers may have much higher peak powers, while embodiments with small diameter VCSELs could have peak powers in the tens of milliwatts to hundreds of milliwatts.

A start time 315 for the transmission of the pulse does not need to coincide with the leading edge of the pulse. As shown, the leading edge of light pulse 310 may be after the start time 315. One may want the leading edge to differ in situations where different patterns of pulses are transmitted at different times, e.g., for coded pulses.

An optical receiver system can start detecting received light at the same time as the laser is started, i.e., at the start time. In other embodiments, the optical receiver system can start at a later time, which is at a known time after the start time for the pulse. The optical receiver system detects background light 330 initially and after some time detects the laser pulse reflection 320. The optical receiver system can compare the detected light intensity against a threshold to identify the laser pulse reflection 320. The threshold can distinguish the background light 330 from light corresponding to the laser pulse reflection 320.

The time-of-flight 340 is the time difference between the pulse being sent and the pulse being received. The time difference can be measured by subtracting the transmission time of the pulse (e.g., as measured relative to the start time) from a received time of the laser pulse reflection 320 (e.g., also measured relative to the start time). The distance to the target can be determined as half the product of the time-of-flight and the speed of light. Pulses from the laser device reflect from objects in the scene at different times and the pixel array detects the pulses of radiation reflection.

B. Detection of Objects Using Array Lasers and Array of Photosensors

Figure 4:
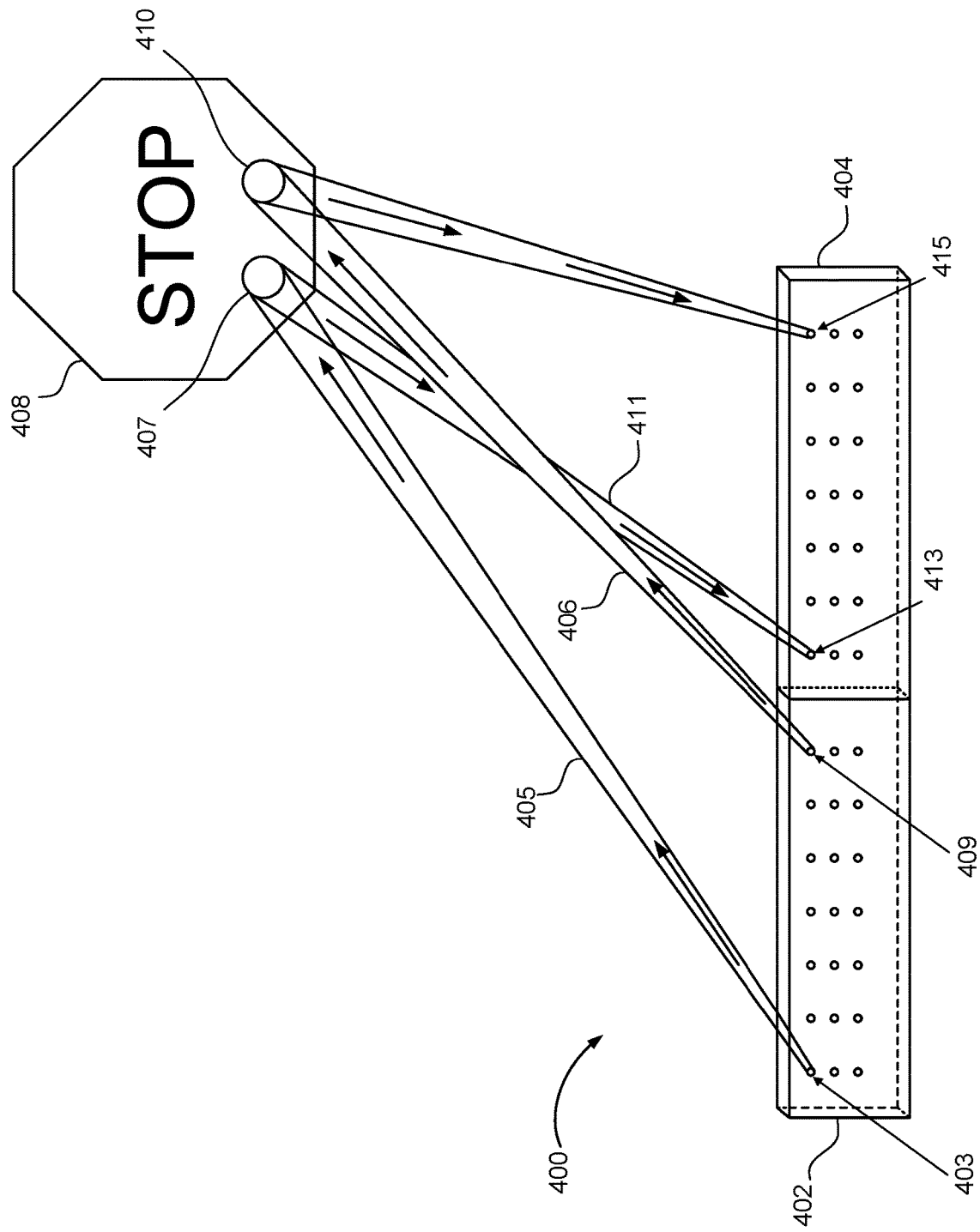
FIG. 4 shows an illustrative example of the light transmission and detection process for a light ranging system according to some embodiments.

FIG. 4 shows an illustrative example of the light transmission and detection process for a light ranging system, according to some embodiments. FIG. 4 shows a light ranging system (e.g., solid state or and/or scanning) collecting three-dimensional distance data of a volume or scene that surrounds the system. FIG. 4 is an idealized drawing to highlight relationships between emitters and sensors, and thus other components are not shown.

Light ranging system 400 includes a light emitter array 402 and a light sensor array 404. The light emitter array 402 includes an array of light emitters, e.g., an array of VCSELs and the like, such as emitter 403 and emitter 409. Light sensor array 404 includes an array of photosensors, e.g., sensors 413 and 415. The photosensors can be pixelated light sensors that employ, for each pixel, a set of discrete photodetectors such as single photon avalanche diodes (SPADs) and the like. However, various embodiments can deploy any type of photon sensors.

Each emitter can be slightly offset from its neighbor and can be configured to transmit light pulses into a different field of view from its neighboring emitters, thereby illuminating a respective field of view associated with only that emitter. For example, emitter 403 emits an illuminating beam 405 (formed from one or more light pulses) into the circular field of view 407 (the size of which is exaggerated for the sake of clarity). Likewise, emitter 409 emits an illuminating beam 406 (also called an emitter channel) into the circular field of view 410. While not shown in FIG. 4 to avoid complication, each emitter emits a corresponding illuminating beam into its corresponding field of view resulting in a 2D array of fields of view being illuminated (21 distinct fields of view in this example).

Each field of view that is illuminated by an emitter can be thought of as a pixel or spot in the corresponding 3D image that is produced from the ranging data. Each emitter channel can be distinct to each emitter and be non-overlapping with other emitter channels, i.e., there is a one-to-one mapping between the set of emitters and the set of non-overlapping fields or view. Thus, in the example of FIG. 4, the system can sample 21 distinct points in the 3D space. A denser sampling of points can be achieved by having a denser array of emitters or by scanning angular position of the emitter beams over time such that one emitter can sample several points in space. As described above, scanning can be accomplished by rotating the entire emitter/sensor assembly.

Each sensor can be slightly offset from its neighbor and, like the emitters described above, each sensor can see a different field of view of the scene in front of the sensor. Furthermore, each sensor's field of view substantially coincides with, e.g., overlaps with and is the same size as a respective emitter channel's field of view.

In FIG. 4, the distance between corresponding emitter-sensor channels is exaggerated relative to the distance to objects in the field of view. In practice, the distance to the objects in the field of few is much greater than the distance between corresponding emitter-sensor channels and thus the path of light from the emitter to the object is approximately parallel to the path of the reflected light back from the object to the sensor (i.e., it is almost "back reflected"). Accordingly, there is a range of distances in front of the system 400 over which the fields of view of individual sensors and emitters are overlapped.

Because the fields of view of the emitters are overlapped with the fields of view of their respective sensors, each sensor channel ideally can detect the reflected illumination beam that originates from its respective emitter channel with ideally no cross-talk, i.e., no reflected light from other illuminating beams is detected. Thus, each photosensor can correspond to a respective light source. For example, emitter 403 emits an illuminating beam 405 into the circular field of view 407 and some of the illuminating beam reflects from the object 408. Ideally, a reflected beam 411 is detected by sensor 413 only. Thus, emitter 403 and sensor 413 share the same field of view, e.g., field of view 407, and form an emitter-sensor pair. Likewise, emitter 409 and sensor 415 form an emitter-sensor pair, sharing field of view 410. While the emitter-sensor pairs are shown in FIG. 4 as being in the same relative locations in their respective array, any emitter can be paired with any sensor depending on the design of the optics used in the system.

During a ranging measurement, the reflected light from the different fields of view distributed around the volume surrounding the LIDAR system is collected by the various sensors and processed, resulting in range information for any objects in each respective field of view. As described above, a time-of-flight technique can be used in which the light emitters emit precisely timed pulses, and the reflections of the pulses are detected by the respective sensors after some elapsed time. The elapsed time between emission and detection and the known speed of light is then used to compute the distance to the reflecting surface. In some embodiments, additional information can be obtained by the sensor to determine other properties of the reflecting surface in addition to the range. For example, the Doppler shift of a pulse can be measured by the sensor and used to compute the relative velocity between the sensor and the reflecting surface. The pulse strength can be used to estimate the target reflectivity, and the pulse shape can be used to determine if the target is a hard or diffuse material.

In some embodiments, the LIDAR system can be composed of a relatively large 2D array of emitter and sensor channels and operate as a solid state LIDAR, i.e., it can obtain frames of range data without the need to scan the orientation of the emitters and/or sensors. In other embodiments, the emitters and sensors can be scanned, e.g., rotated about an axis, to ensure that the fields of view of the sets of emitters and sensors sample a full 360 degree region (or some useful fraction of the 360 degree region) of the surrounding volume. The range data collected from the scanning system, e.g., over some predefined time period, can then be post-processed into one or more frames of data that can then be further processed into one or more depth images or 3D point clouds. The depth images and/or 3D point clouds can be further processed into map tiles for use in 3D mapping and navigation applications.

C. Multiple Photodetectors in Each Photosensor

Figure 5:
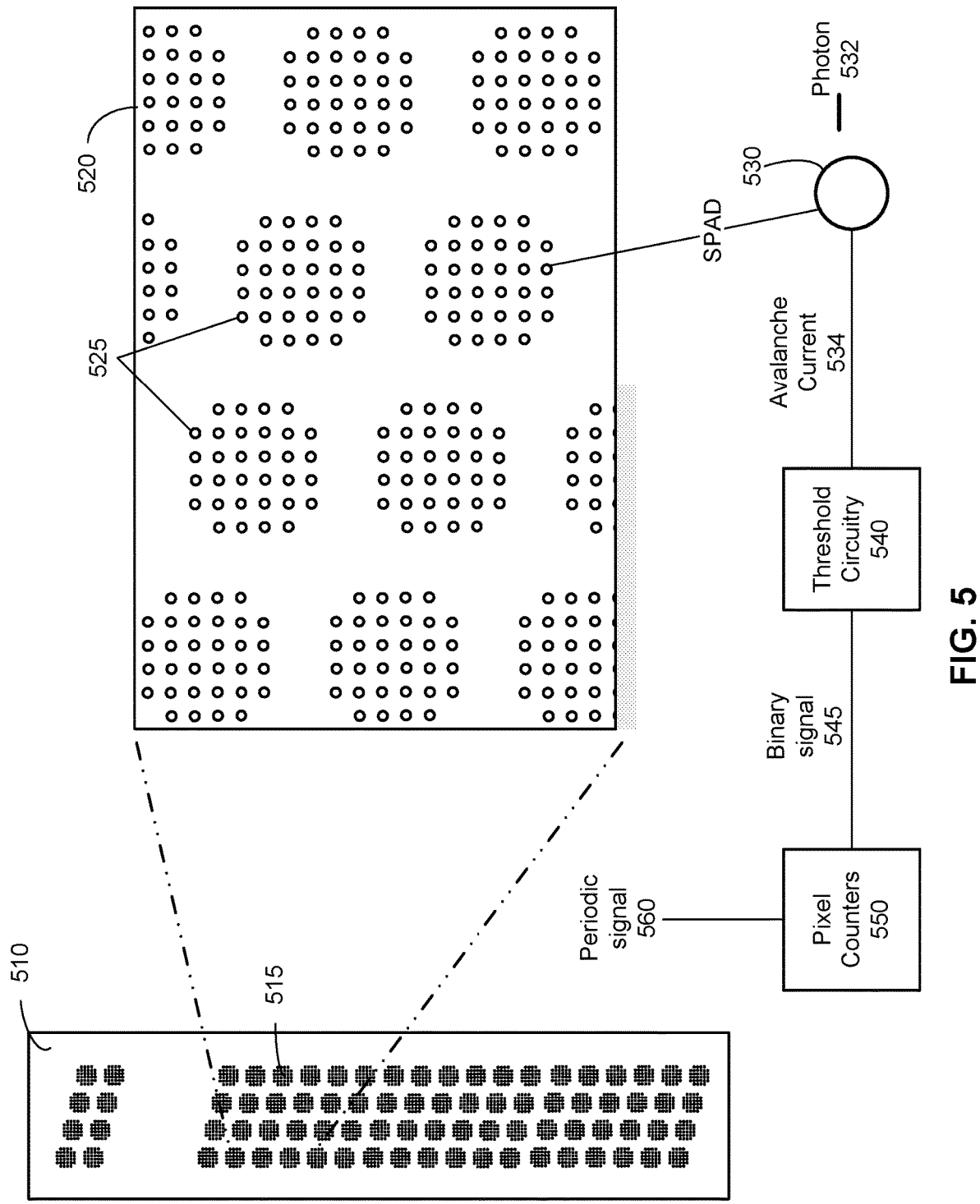
FIG. 5 shows various stages of a sensor array and associated electronics according to embodiments of the present invention.

FIG. 5 shows various stages of a sensor array and associated electronics according to embodiments of the present invention. Array 510 shows photosensors 515 that each correspond to a different pixel. Array 510 can be a staggered array. In this specific example, array 510 is 18×4 photosensors. Array 510 can be used to achieve a high resolution (e.g. 72×1024) as the implementation is amenable to sweeping.

Array 520 shows a magnified view of a portion of array 510. As can be seen, each photosensor 515 is composed of a plurality of photodetectors 525. Signals from the photodetectors of a pixel collectively contribute to a measurement for that pixel.

In some embodiments, each pixel has a multitude of single-photon avalanche diode (SPAD) units that increase the dynamic range of the pixel itself. Each SPAD can have an analog front end circuit for biasing, quenching, and recharging. SPADs are normally biased with a biased voltage above the breakdown voltage. A suitable circuit senses the leading edge of the avalanche current, generates a standard output pulse synchronous with the avalanche build-up, quenches the avalanche by lowering the bias down below the breakdown voltage, and restore the photodiode to the operative level.

The SPADs may be positioned so as to maximize the fill factor in their local area, or a microlens array may be used, which allows for high optical fill factors at the pixel level. Accordingly, an imager pixel can includes an array of SPADs to increase the efficiency of the pixel detector. A diffuser may be used to spreads rays passed through an aperture and collimated by a microlens. The can diffuser serves to spread the collimated rays in a way that all the SPADs belonging to the same pixel receive some radiation.

FIG. 5 further shows a particular photodetector 530 (e.g., a SPAD) that detects a photon 532. In response to the detection, photodetector 530 produces an avalanche current 534 of charge carriers (electrons or holes). Threshold circuitry 540 conditions the avalanche current 534 by comparing it to a threshold. When a photon is detected and photodetector 530 is functioning properly, the avalanche current 534 rises above the comparator threshold and threshold circuitry 540 produces a temporally accurate binary signal 545 indicating the accurate time of the SPAD current avalanche, which is in turn an accurate measurement of the photon arrival. The correlation of the current avalanche to the photon arrival can occur with a resolution of nanoseconds, thereby providing high timing resolution. The rising edge of binary signal 545 can be latched by pixel counters 550.

Binary signal 545, avalanche current 534, and pixel counters 550 are examples of data values that can be provided by a photosensor composed of one or more SPADs. The data values can determined from respective signals from each of the plurality of photodetectors. Each of the respective signals can be compared to a threshold to determine whether a corresponding photodetector triggered. Avalanche current 534 is an example of an analog signal, and thus the respective signals can be analog signals.

Pixel counters 550 can use binary signal 545 to count the number of photodetectors for a given pixel that have been triggered by one or more photons during a particular time bin (e.g., a time window of 1, 2, 3, etc. ns) as controlled by periodic signal 560. Pixel counters 550 can store counters for each of a plurality of time bins for a given measurement. The value of the counter for each time bind can start at zero and be incremented based on binary signal 545 indicating a detection of a photon. The counter can increment when any photodetector of the pixel provide such a signal.

Periodic signal 560 can be produced by a phase-locked loop (PLL) or delay-locked loop (DLL) or any other method of producing a clock signal. The coordination of periodic signal 560 and pixel counter 550 can act as a time-to-digital converter (TDC), which is a device for recognizing events and providing a digital representation of the time they occurred. For example, a TDC can output the time of arrival for each detected photon or optical pulse. The measure time can be an elapsed time between two events (e.g., start time and detected photon or optical pulse) rather than an absolute time. Periodic signal 560 can be a relatively fast clock that switches between a bank of memory comprising pixel counter 550. Each register in memory can correspond to one histogram bin, and the clock can switch between them at the sampling interval. Accordingly, a binary value indicating a triggering can be sent to the histogram circuitry when the respective signal is greater than the threshold. The histogram circuitry can aggregate binary values across the plurality of photodetectors to determine a number of photodetectors that triggered during a particular time bin.

The time bins can be measured relative to a start signal, e.g., at start time 315 of FIG. 3. Thus, the counters for time bins right after the start signal may have low values corresponding to a background signal, e.g., background light 330. A last time bin can correspond to an end of a detection time interval (also called a shot) for a given pulse train, which is further described in the next section. The number of cycles of periodic signal 560 since a start time can act as a timestamp for when a rising edge of avalanche current 534 indicates a detected photon. The timestamp corresponds to the time bin for a particular counter in pixel counters 550. Such an operation is different from a simple analog-to-digital converter (ADC) following a photodiode (e.g., as for an avalanche photodiode (APD)). Each of the counters of the time bins can correspond to a histogram, which is described in more detail below. Therefore, while the APD is a linear amplifier for the input optical signal with limited gain, the SPAD is a trigger device that provides a binary output of yes/no for a triggering event occurring in a time window.

D. Pulse Trains

Ranging may also be accomplished by using a pulse train, defined as containing one or more pulses. Within a pulse train, the number of pulses, the widths of the pulses, and the time duration between pulses (collectively referred to as a pulse pattern) can be chosen based on a number of factors, some of which includes:

1—Maximum laser duty cycle—The duty cycle is the fraction of time the laser is on. For a pulsed laser this could be determined by the FWHM as explained above and the number of pulses emitted during a given period.

2—Eye safety limits—This is determined by maximum amount of radiation a device can emit without damaging the eyes of a bystander who happens to be looking in the direction of the LIDAR system.

3—Power consumption—This is the power that the emitter consumes for illuminating the scene.

For example, the spacing between pulses in a pulse train can be on the order of single digits or 10 s of nanoseconds.

Multiple pulse trains can be emitted during the time span of one measurement. Each pulse train can correspond to a different time interval, e.g., a subsequent pulse train is not emitted until an expiration of the time limit for detecting reflected pulses of a previous pulse train.

For a given emitter or laser device, the time between the emissions of pulse trains determines the maximum detectable range. For example, if pulse train A is emitted at time $t_0=0$ ns, and pulse train B is emitted at time $t_1=1000$ ns, then one must not assign reflected pulse trains detected after $t_1$ to pulse train A, as they are much more likely to be reflections from pulse train B. Thus, the time between pulse trains and the speed of light define a maximum bound on the range of the system given in the following equation.

$$R_{max}=c\times(t_1-t_0)/2$$

The time between shots (emission and detection of pulse trains) can be on the order of 1 µs to allow enough time for the entire pulse train to travel to a distant object approximately 150 meters away and then back.

III. Histogram Signals from Photodetectors

One mode of operation of a LIDAR system is time-correlated single photon counting (TCSPC), which is based on counting single photons in a periodic signal. This technique works well for low levels of periodic radiation which is suitable in a LIDAR system. This time correlated counting may be controlled by periodic signal 560 of FIG. 5 and may use time bins, as discussed for FIG. 5.

The frequency of the periodic signal can specify a time resolution within which data values of a signal are measured. For example, one measured value can be obtained for each photosensor per cycle of the periodic signal. In some embodiments, the measurement value can be the number of photodetectors that the triggered during that cycle. The time period of the periodic signal corresponds to time bin, with each cycle being a different time bin.

Figure 6:
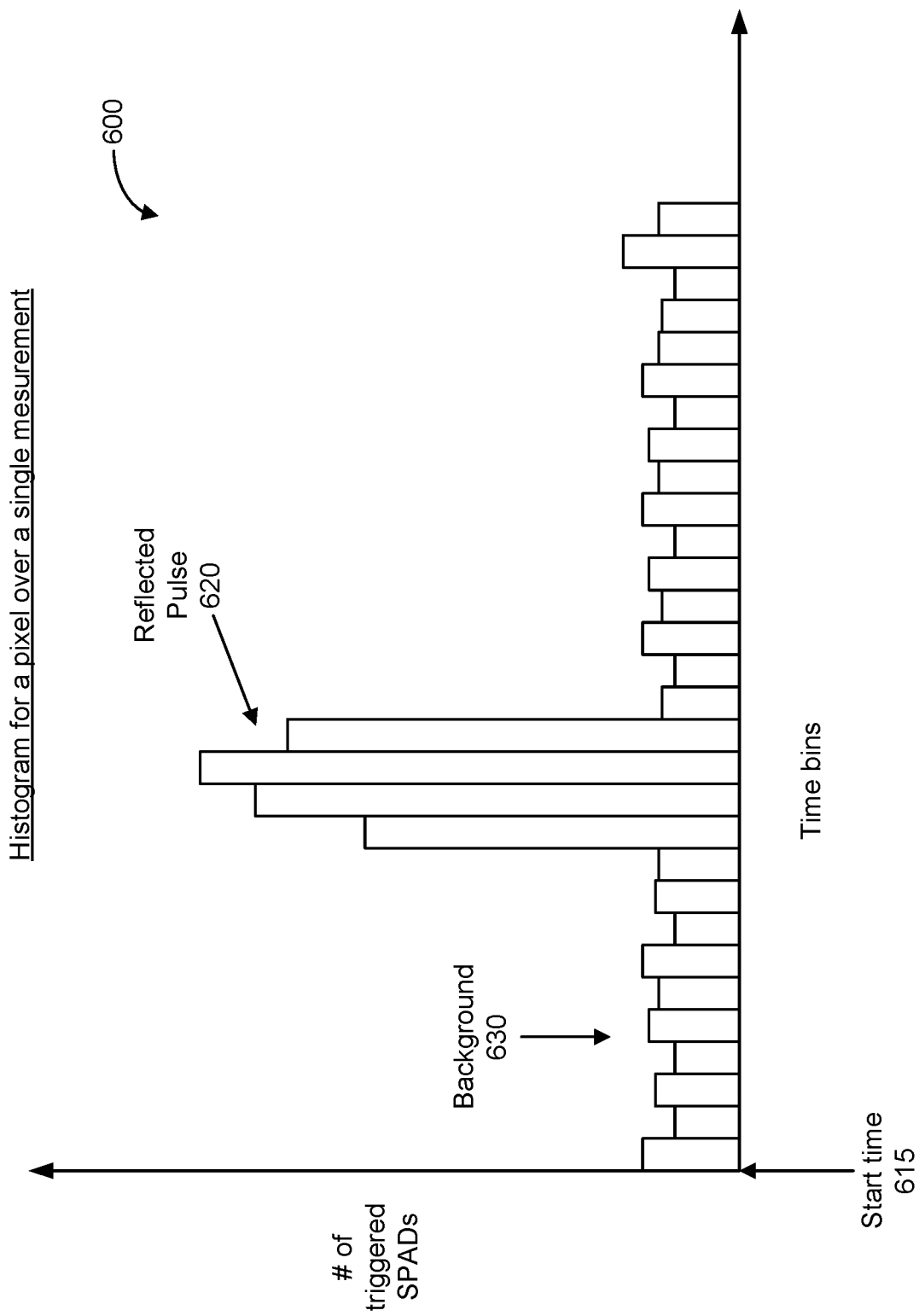
FIG. 6 shows a histogram according to embodiments of the present invention.

FIG. 6 shows a histogram 600 according to embodiments of the present invention. The horizontal axis corresponds to time bins as measured relative to start time 615. As described above, start time 615 can correspond to a start time for the pulse train. Any offsets between rising edges of the first pulse of a pulse train and the start time for either or both of a pulse train and a detection time interval can be accounted for wherein determining the received time to be used for the time-of-flight measurement. The vertical axis corresponds to the number of triggered SPADs. In certain embodiments, the vertical axis may correspond to an output of an ADC that follows an APD. For example, APDs can exhibit traditional saturation effects, such as a constant maximum signal rather than the dead-time based effects of SPADs. Some effects can occur for both SPADs and APDs, e.g., pulse smearing of very oblique surfaces may occur for both SPADs and APDs.

The counter for each of the time bins corresponds to a different bar in histogram 600. The counters at the early time bins are relatively low and correspond to background noise 630. At some point, a reflected pulse 620 is detected. The corresponding counters are much larger, and may be above a threshold that discriminate between background and a detected pulse. The reflected pulse 620 (after digitizing) is shown corresponding to four time bins, which might result from a laser pulse of a similar width, e.g., a 4 ns pulse when time bins are each 1 ns. But, as described in more detail below, the number of time bins can vary, e.g., based on properties of a particular object in an angle of incidence of the laser pulse.

The temporal location of the time bins corresponding to reflected pulse 620 can be used to determine the received time, e.g., relative to start time 615. As described in more detail below, matched filters can be used to identify a pulse pattern, thereby effectively increasing the signal-to-noise ratio, but also to more accurately determine the received time. In some embodiments, the accuracy of determining a received time can be less than the time resolution of a single time bin. For instance, for a time bin of 1 ns, that resolution would correspond to about 15 cm. However, it can be desirable to have an accuracy of only a few centimeters.

Accordingly, a detected photon can result in a particular time bin of the histogram being incremented based on its time of arrival relative to a start signal, e.g., as indicated by start time 615. The start signal can be periodic such that multiple pulse trains are sent during a measurement. Each start signal can be synchronized to a laser pulse train, with multiple start signals causing multiple pulse trains to be transmitted over multiple detection intervals. Thus, a time bin (e.g., from 200 to 201 ns after the start signal) would occur for each detection interval. The histogram can accumulate the counts, with the count of a particular time bin corresponding to a sum of the measured data values all occurring in that particular time bin across multiple shots. When the detected photons are histogrammed based on such a technique, it results in a return signal with a signal to noise ratio greater than from a single pulse train by the square root of the number of shots taken.

Figure 7:
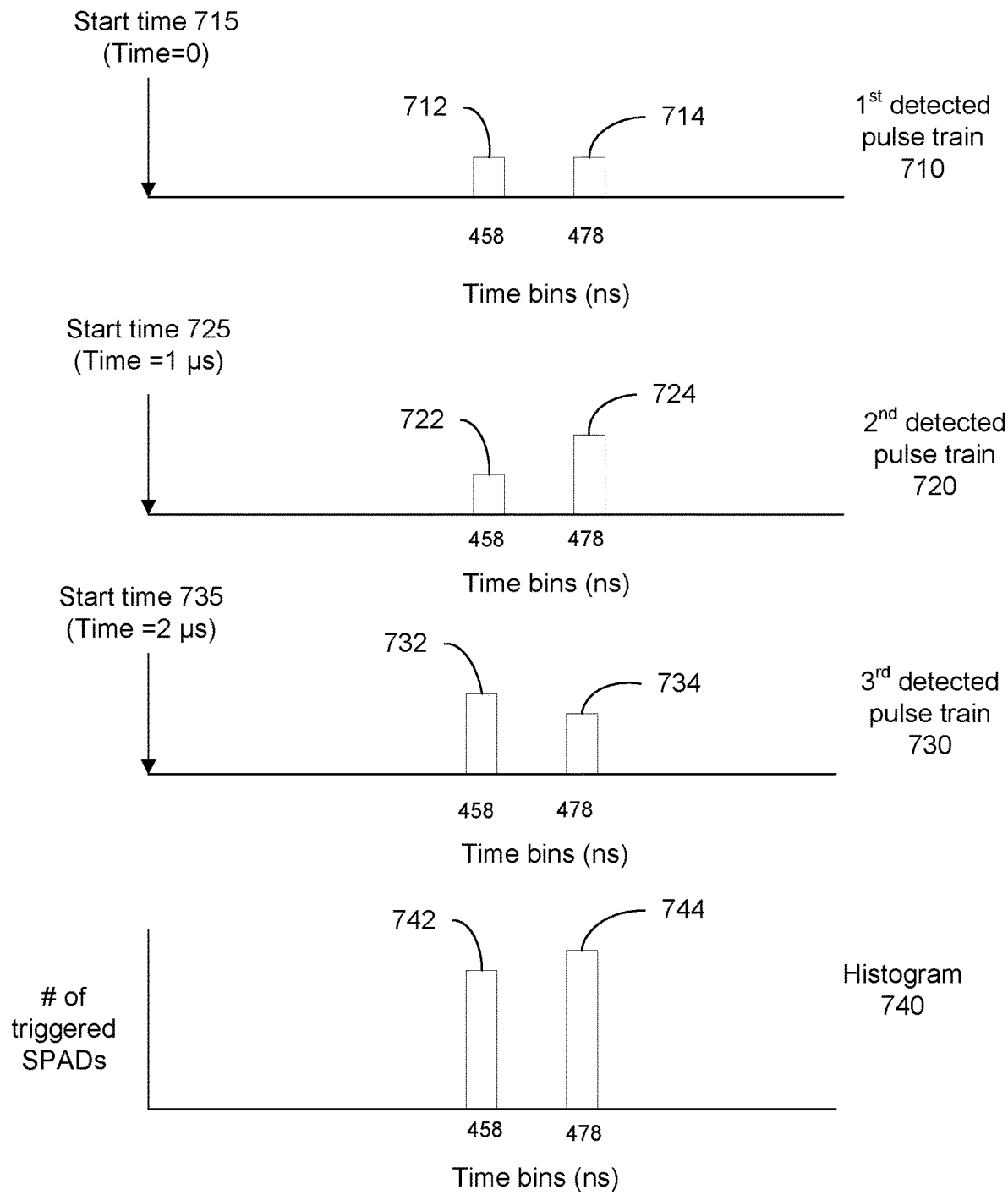
FIG. 7 shows the accumulation of a histogram over multiple pulse trains for a selected pixel according to embodiments of the present invention.

FIG. 7 shows the accumulation of a histogram over multiple pulse trains for a selected pixel according to embodiments of the present invention. FIG. 7 shows three detected pulse trains 710, 720 and 730. Each detected pulse train corresponds to a transmitted pulse train that has a same pattern of two pulses separated by a same amount of time. Thus, each detected pulse train has a same pulse pattern, as shown by two time bins having an appreciable value. Counters for other time bins are not shown for ease of illustration, although the other time bins may have relatively low non-zero values.

In the first detected pulse train 710, the counters for time bins 712 and 714 are the same. This can result from a same number of photodetectors detecting a photon during the two time bins. Or, in other embodiments, approximately the same number of photons being detected during the two time bins. In other embodiments, more than one consecutive time bin can have a consecutive non-zero value; but for ease of illustration, individual nonzero time bins have been shown.

Time bins 712 and 714 respectively occur 458 ns and 478 ns after start time 715. The displayed counters for the other detected pulse trains occur at the same time bins relative to their respective start times. In this example, start time 715 is identified as occurring at time 0, but the actual time is arbitrary. The first detection interval for the first detected pulse train can be 1 μs. Thus, the number of time bins measured from start time 715 can be 1,000. After, this first detection interval ends, a new pulse train can be transmitted and detected. The start and end of the different time bins can be controlled by a clock signal, which can be part circuitry that acts as a time-to-digital converter (TDC), e.g., as is described in FIG. 5.

For the second detected pulse train 720, the start time 725 is at 1 μs, e.g., at which the second pulse train can be emitted. Such a separate detection interval can occur so that any pulses transmitted at the beginning of the first detection interval would have already been detected, and thus not cause confusion for pulses detected in the second time interval. For example, if there is not extra time between shots, then the circuitry could confuse a retroreflective stop sign at 200 m with a much less reflective object at 50 m (assuming a shot period of about 1 μs). The two detection time intervals for pulse trains 710 and 720 can be the same length and have the same relationship to the respective start time. Time bins 722 and 724 occur at the same relative times of 458 ns and 478 ns as time bin 712 and 714. Thus, when the accumulation step occurs, the corresponding counters can be added. For instance, the counter values at time bin 712 and 722 can be added together.

For the third detected pulse train 730, the start time 735 is at 2 μs, e.g., in which the third pulse train can be emitted. Time bin 732 and 734 also occur at 458 ns and 478 ns relative to its respective start time 735. The counters at different time bins may have different values even though the emitted pulses have a same power, e.g., due to the stochastic nature of the scattering process of light pulses off of objects.

Histogram 740 shows an accumulation of the counters from three detected pulse trains at time bins 742 and 744, which also correspond to 458 ns and 478 ns. Histogram 740 could have less number of time bins that are measured during the respective detection intervals, e.g., as a result of dropping time bins in the beginning or the end, or that have values less than a threshold. In some implementations, about 10-30 time bins can have appreciable values, depending on the pattern for a pulse train.

As examples, the number of pulse trains emitted during a measurement to create a single histogram can be around 1-40 (e.g., 24), but can also be much higher, e.g., 50, 100, or 500. Once a measurement is completed, the counters for the histogram can be reset, and a set of pulse trains can be emitted to perform a new measurement. In various embodiments and depending on the number of detection intervals in the respective duration, measurements can be performed every 25, 50, 100, or 500 μs. In some embodiments, measurement intervals can overlap, e.g., so a given histogram corresponds to a particular sliding window of pulse trains. In such an example, memory can exist for storing multiple histograms, each corresponding to a different time window. Any weights applied to the detected pulses can be the same for each histogram, or such weights could be independently controlled.

IV. Histogram Data Path

Figure 8:
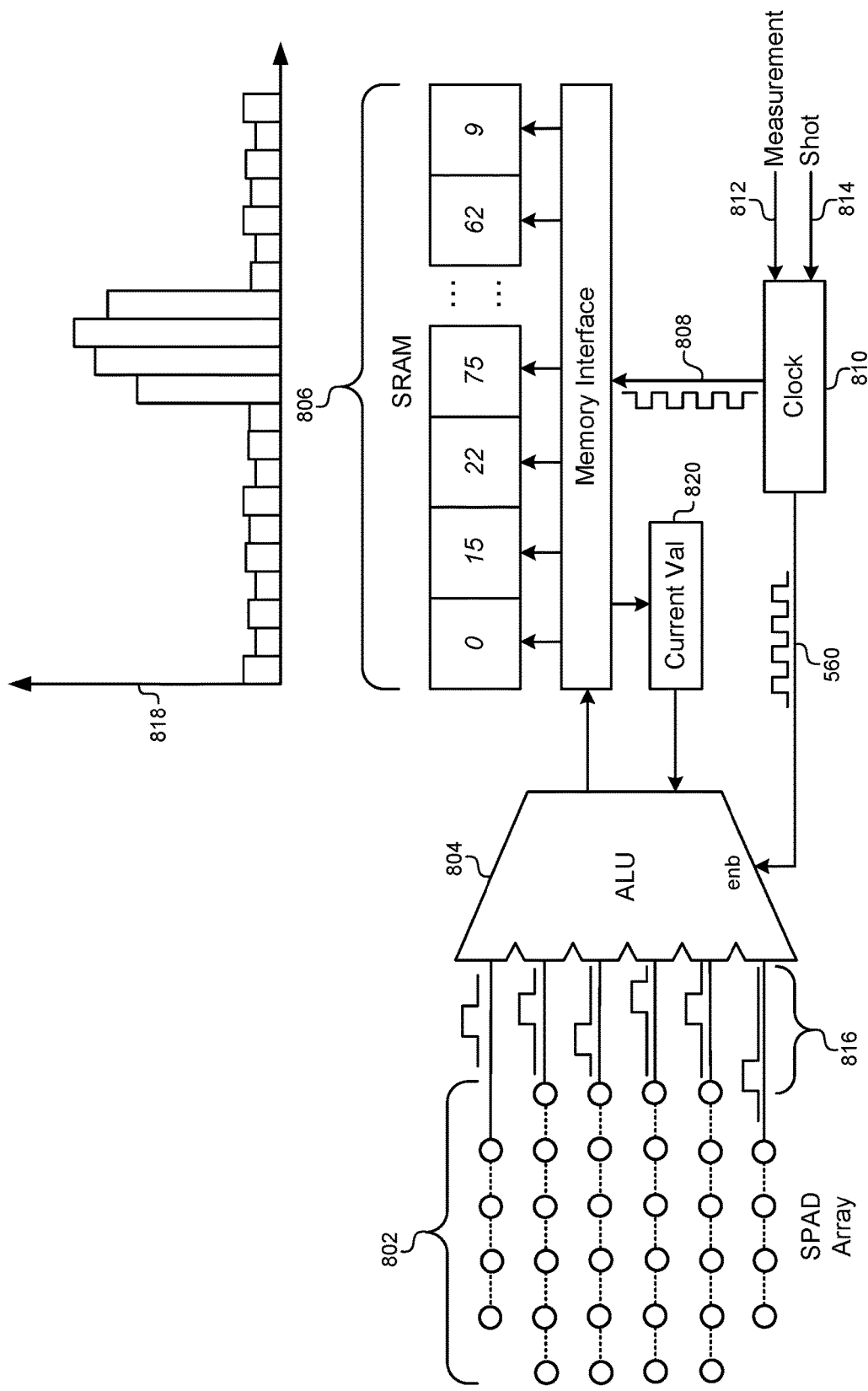
FIG. 8 shows a circuit for receiving photons and generating a set of signals that are stored in a memory representing histogram, according to some embodiments.

FIG. 8 shows a circuit for receiving photons and generating a set of signals that are stored in a memory representing histogram, according to some embodiments. As described above in relation to FIG. 5, an array of photosensors may be used to receive reflected pulses and ambient light in an optical measurement system. A single photosensor 802 may include a plurality of photodetectors. Each photodetector may be implemented by a SPAD or other light-sensitive sensor, and the photodetectors may be arranged in a grid pattern for the photosensor 802 as illustrated in FIG. 8.

Each photodetector in the photosensor 802 may include analog front-end circuitry for generating an output signal indicating when photons are received by the photodetectors. For example, referring back to FIG. 5, the avalanche current 534 from a SPAD may trigger the threshold circuitry 540 to generate the output binary signal 545. Turning back to FIG. 8, each photodetector in the photosensor 802 may generate its own signal corresponding to received photons. Thus, the photosensor 802 may generate a set of signals 816 corresponding to the number of photodetectors in the photosensor 802. The photosensor 802 may also be referred to as a "pixel" or a "pixel sensor," as it may correspond to a single pixel of information when displayed or analyzed in later stages of the optical measurement system. When signals are generated in response to received photons (e.g., transitioning from a logical "0" to a logical "1"), this may be referred to as a "positive" signal.

An arithmetic logic unit (ALU) 804 may be used to implement the functionality of the pixel counter 550 from FIG. 5. Specifically, the ALU 804 may receive the set of signals 816 from the individual photodetectors of the photosensor 802 and aggregate a number of these signals that each indicate the detection of a photon. The ALU 804 may include a combinational digital electronic circuit that performs arithmetic and/or other bitwise operations on the set of signals 816. For example, the ALU 804 may receive each of the set of signals 816 as a binary signal (i.e., a "0" or a "1") as an input or operand to the ALU 804. By aggregating or adding inputs together, the ALU 804 may count a number positive signals in the set of signals 816 that indicate that photons have been received within a particular time bin. For example, by adding each of the signals indicating a "1" signal level, the output of the ALU 804 may indicate the number of signals in the set of signals 816 that are associated with photodetectors that in turn received photons during the time bin.

The ALU 804 is designed specifically to receive at least a number of inputs that correspond to the number of photodetectors in the photosensor 802. In the example of FIG. 8, the ALU 804 may be configured to receive 32 parallel inputs that are a single bit wide. Internally, the ALU 804 may be implemented with digital logic gates to form a ripple-carry adder, a carry-lookahead adder, a carry-save adder, and/or any other type of adder that can aggregate a relatively large number of inputs with low propagation time. The output of the ALU 804 may be referred to as a "total signal count" and may be represented as an n-bit binary number output from the ALU 804 or from a stage of the ALU 804.

As described above, the output of the ALU 804 may characterize the total number of photons received by the photosensor 802 during a particular time bin. Each time the ALU 804 completes an aggregation operation, the total signal count can be added to a corresponding memory location in a memory 806 representing histogram 818. In some embodiments, the memory 806 may be implemented using an SRAM. Thus, over the course of multiple shots (with each shot including a pulse train) the total signal count from the ALU 804 can be aggregated with an existing value in a corresponding memory location in the memory 806. A single measurement may be comprised of a plurality of shots that populate the memory 806 to generate the histogram 818 of values in the time bins that can be used to detect reflected signals, ambient noise, peaks, and/or other signals of interest.

The ALU 804 may also perform a second aggregation operation that adds the total signal count to an existing value in a memory location of the memory 806. Recall from FIG. 7 that with each shot, a new total signal count may be added to an existing value in the corresponding time bin of the memory 806. In this manner, the histogram 818 can be gradually constructed in the memory 806 over a number of shots. When the total signal count is generated by the ALU 814, a current value 820 of a corresponding memory location for that time bin can be retrieved from the memory 806. The current value 820 can be provided as an operand to the ALU 804, which can be combined with the total signal count from the set of signals 816. In some embodiments, the ALU 804 can be composed of a first stage and a second stage, where the first stage calculates the total signal count from the photosensor 802, and the second stage combines the total signal count with the current value 820 from that time bin's memory location in the memory 806. In some embodiments, the aggregation of the set of signals 816 and the aggregation of total signal count and the current value 820 may be carried out as a single operation. Thus, even though these two operations may functionally be described as separate "aggregations," they may in fact be performed together using a combination of parallel and sequential circuitry in the ALU 804.

As described above in relation to FIG. 5, the ALU 804 may receive a periodic signal 560 that triggers the aggregation operation(s). The periodic signal 560 may be generated using any of the techniques described above. The periodic signal 560 may define the length of each time bin. In some embodiments, the periodic signal 560 and the corresponding time bins can be measured relative to a start signal as illustrated in FIG. 3. Each cycle of the periodic signal 560 can cause aggregation operations to execute in the ALU 804 and may cause the memory address of the memory 860 increment to the next time bin. For example, a rising edge of the periodic signal 560 may cause the ALU 804 to produce a result that aggregates the total signal count and the current value 820 together. A corresponding periodic signal 808 may also be sent to a memory interface circuit that increments an address to a memory location of a current time bin such that each cycle also moves to the next time bin in the memory 806.

A clock circuit 810 may be used to generate the periodic signal 560 based on inputs that define shots and measurements for the optical measurement system. For example, a shot input 814 may correspond to the start signal illustrated in FIG. 3. The shot input 814 may reset the address for the memory 806 to a beginning memory location corresponding with a first time bin of the histogram 818. The shot input 814 may also cause the clock circuit 810 to begin generating the periodic signal 560 for the ALU 804 and/or the periodic signal 808 that increments the address for the memory 806. Additionally, the clock circuit 810 may receive a measurement input 812 that defines the beginning/end of a measurement. A measurement may be comprised of a plurality of shots that incrementally build the histogram 818. The measurement signal 812 may be used to reset the values in the memory 806 such that the histogram can start over for each new measurement.

The memory 806 may include a plurality of registers that accumulate photon counts from photodetectors. By accumulating photon counts in respective registers corresponding to time bins, the registers in the memory 806 can store photon counts based on arrival times of the photons. For example, photons arriving in a first time bin can be stored in a first register in the memory 806, photons arriving in a second time bin can be stored in a second register in the memory 806, and so forth. Each "shot" may include one traversal through each of the registers in the memory 806 corresponding to a time bin for that photosensor. The shot signal 814 may be referred to as an "enable" signal for the plurality of registers in the memory 806 in that the shot signal 814 enables the registers in the memory 806 to store results from the ALU 804 during the current shot.

The periodic signal 560 can be generated such that it is configured to capture the set of signals 816 as they are provided asynchronously from the photosensor 802. For example, the threshold circuitry 540 may be configured to hold the output signal high for a predetermined time interval. The periodic signal 560 may be timed such that it has a period that is less than or equal to the hold time for the threshold circuitry 540. Alternatively, the period of the periodic signal 560 may be a percentage of the hold time for the threshold circuitry 540, such as 90%, 80%, 75%, 70%, 50%, 110%, 120%, 125%, 150%, 200%, and so forth. Some embodiments may use rising-edge detection circuitry as illustrated in FIG. 5 to convert the asynchronous signals from the photodetectors into single clock strobes that use the same clock that runs the ALU 804. This may guarantee that photons are not counted more than once. Other embodiments may alternatively oversample the asynchronous pulses from the photodetectors or use brute-force rising-edge detection.

Figure 9:
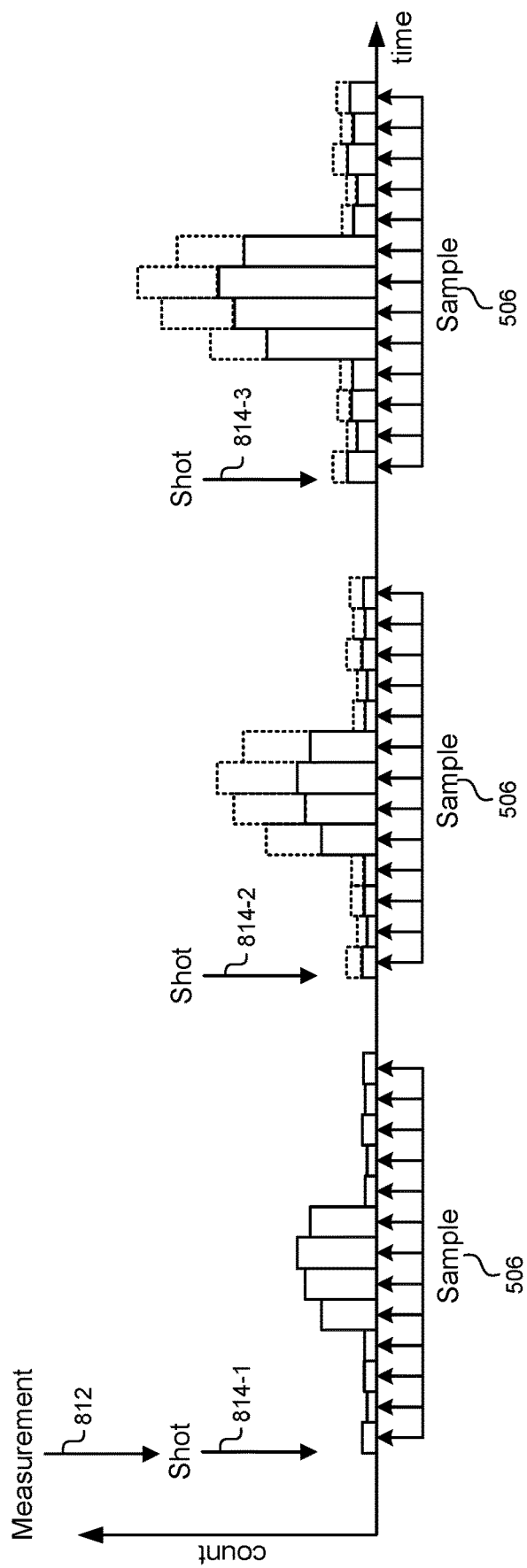
FIG. 9 shows the timing associated with different shots in a measurement, according to some embodiments.

FIG. 9 shows the timing associated with different shots in a measurement, according to some embodiments. The vertical axis represents the total number of photodetector signals measured for a single photosensor. For example, the vertical axis may represent a total photon count. The horizontal axis represents time. When a new optical measurement is started as indicated by the measurement signal 812, a first shot can begin with the receipt of the shot signal 814-1 as a start signal. The periodic signal 506 illustrates how each clocking of the ALU 804 corresponds to a single time bin and corresponding memory location in the memory 806.

With each subsequent shot, the histogram can be constructed in the memory 806 as illustrated in FIG. 9. Each time a shot input 814 is received, the addressing of the memory 806 can be reset such that new total signal count can be added to the existing signal counts. In the example of FIG. 9, there is a non-zero time interval of separation between each shot. For example, the shot started by the shot signal 814-1 ends, and a non-zero time interval elapses before the shot defined by the shot signal 814-2 begins. Alternatively, some embodiments may not have a delay between subsequent shots such that the periodic signal 506 clocks continuously throughout the measurement. Subsequent shot signals 814-2, 814-3 may then define both the end of a previous shot and the beginning of a subsequent shot.

In some embodiments, the timing of the measurement signal 812, the shot signal 814, and the periodic signal 506 that clocks the ALU 804 may all be coordinated and generated relative to each other. Thus, the clocking of the ALU may be triggered by, and dependent on, the start signal for each shot. Additionally the period of the periodic signal 506 may define the length of each time bin associated with each memory location in the histogram.

The data path illustrated in FIG. 8 is primarily configured to build the histogram 818 over a number of shots. However, the histogram may only populated during shots in some embodiments. Any photons received between shots would not be aggregated by the ALU 804 in a time bin and would not be stored in the memory 806. Additionally, after each measurement is complete and before a subsequent measurement begins, the contents of the memory 806 may be reset. Therefore, photons received before and/or after a current measurement may not be saved or readily available. Furthermore, no total count of all photons received in the histogram is readily available in the histogram data path, and no total count of all photons received during a measurement cycle is available if there are non-zero intervals between shots when the histogram is disabled. To record received photons in a continuous manner that is not reliant on the shot/measurement timing, a second parallel data path may be used in addition to the histogram data path illustrated in FIG. 8.

V. Integration Data Path

In order to record cumulative photon totals for all photodetectors in a photosensor, some embodiments may provide a parallel data path that includes an integration register. This integration data path may receive the total positive signal count for each time bin and add that value to a single integration register instead of separate time bins to form a histogram. This integration register can record photon counts before, between, and after shots. It can even record photon counts when no active measurement, or shot within a multi-shot measurement, is taking place because it can be clocked separately and independently from the histogram data path described above. It provides a readily-available total of photons for a photosensor or pixel that can be used to estimate background noise, set thresholds, and provide real-time image data.

Figure 10:
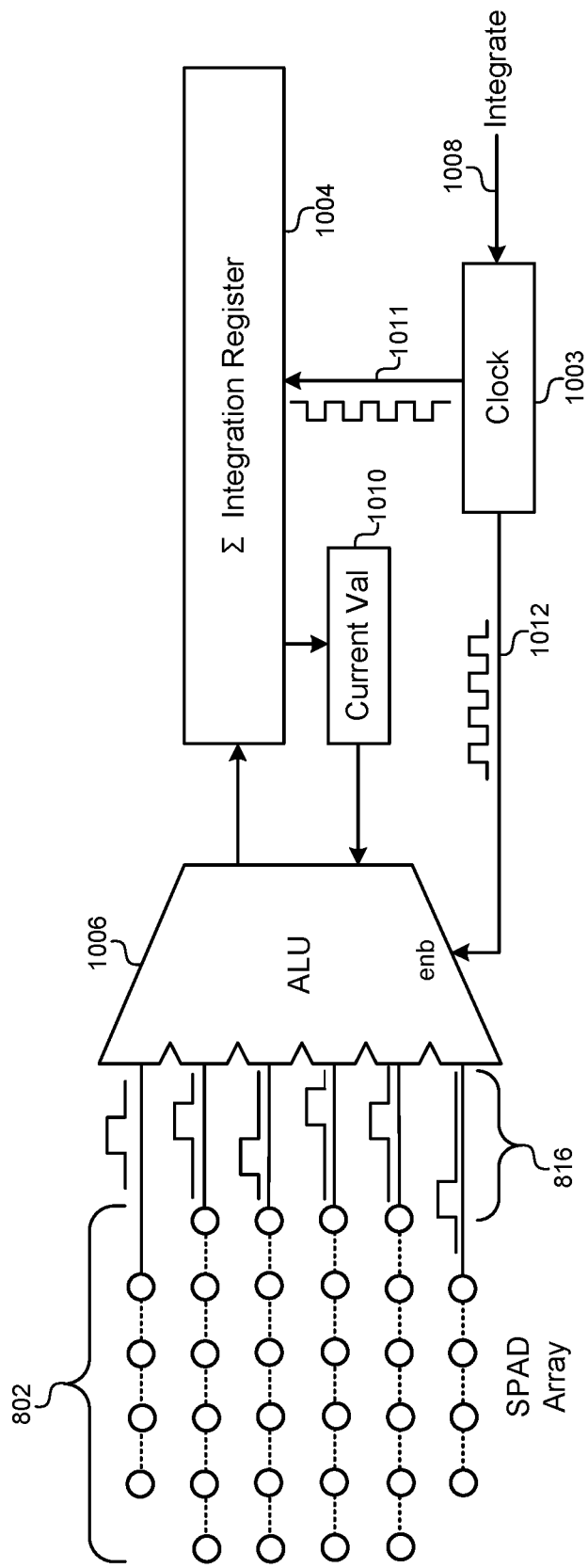
FIG. 10 shows a data path with an integration register, according to some embodiments.

FIG. 10 shows a data path with an integration register, according to some embodiments. The photosensor 802 with the plurality of photodetectors may generate the set of signals 816 as described above in relation to FIG. 8. A second ALU 1006 can aggregate the positive signals received during a time bin as described above. However, instead of storing the total signal count aggregated by the ALU 1006 in discrete time bins in the memory 806, this second data path can add the total signal count to a value stored in an integration register 1004 that represents a total number of positive signals received from the photodetectors across each of the time bins over any number of shots. For example, the integration register 1004 can provide a current value 1010 in the integration register 1004 to the ALU 1006. A first stage of the ALU 1006 can aggregate the set of signals 816 from the photosensor 802 to generate a total signal count for a current time bin. A second stage of the ALU 1006 can then add the total signal count for the current time bin to the current value 1010 representing the total photon count in the integration register 1004 and store the updated total photon count in the integration register 1004.

An integrate signal 1008 may be provided to a clock circuit 1003 to begin an integration cycle. The clock circuit 1003 can generate a periodic signal 1012 that can clock the ALU 1006. For example, the periodic signal 1012 can define time bins during which the set of signals 816 can be aggregated by the ALU 1006. The clock circuit 1003 may also generate a periodic signal 1011 that is used to latch a new value into the integration register 1004. For example, a rising clock edge on the periodic signal 1011 may cause the integration register 1004 to latch the result from the ALU 1006. The result from the ALU 1006 may be the aggregated total of the total signal counts and the current value 1010 of the integration register 1004 before latching the new result value.

The timing associated with the integration register 1004 and/or the ALU 1006 may be independent from the timing of the clock circuit 810 in the histogram data path of FIG. 8. For example, the periodic signal 1012 in the integration data path need not be phase-aligned with the periodic signal 560 in the histogram data path. These periodic signals 1012, 560 may also have different periods and/or duty cycles. Additionally, the integrate signal 1008 that defines the beginning and/or length of an integration cycle need not be aligned with or derived from the shot signal 814 or the measurement signal 812 of the histogram data path. Thus, the timing of the histogram data path and the integration data path can be completely independent from each other.

In some embodiments, the integration register 1004 can accumulate photon counts from the photosensor 802 during one or more intervals that are defined by the integrate signal 1008. In this sense, the integrate signal 1008 may also be referred to as an "enable" signal in that it enables the integration register 1004 to accumulate photon counts. In some embodiments, each enablement of the integrate signal 1008 may reset the integration register 1004 such that the accumulation of the photon counts starts over. In other embodiments, each enablement of the integrate signal 1008 may restart the integration register 1004 such that it continues accumulating photon counts where it left off. This allows the integration register 1004 to accumulate photon counts over one or more time intervals that can be defined by the integrate (i.e., enable) signal 1008.

Figure 11:
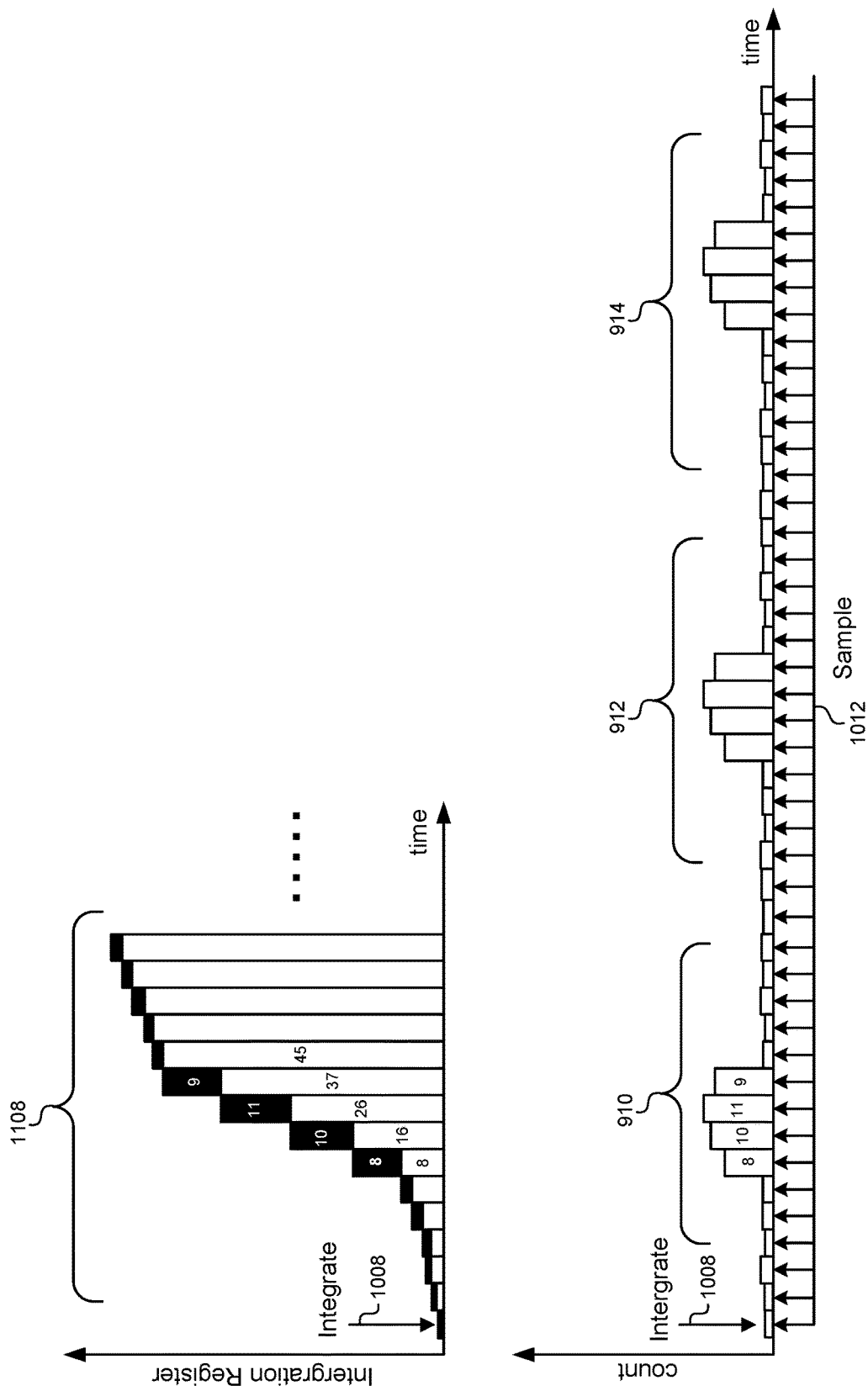
FIG. 11 shows a timing graph for the integration data path, according to some embodiments.

FIG. 11 shows a timing graph for the integration data path, according to some embodiments. The vertical axis on the bottom graph represents the total signal count for each time bin. The vertical axis the top graph represents the total value stored in the integration register. The horizontal axes of the top graph and the bottom graph represent time. When the integrate signal is received 1008, the clock circuit 1003 may begin generating the periodic signal 1012. As illustrated in the bottom graph, the periodic signal 1012 may define the time bins for each sampling of the ALU 1006. Note that the term "time bins" in the integration data path need not correspond to specific memory locations in a histogram as the time bins do in the histogram data path. Instead, the time bins of the integration data path refer to the interval between when aggregation results become available from the ALU 1006. As described above for the periodic signal 560 of the histogram data path, the frequency of the periodic signal 1012 of the integration data path may be timed relative to the hold time of the threshold circuitry 540 such that positive sensor responses to photons are not missed or over counted between aggregation operations of the ALU 1006. In some embodiments, the analog front ends for the SPADs may implement rising-edge detectors to convert photodetector signals to a synchronous clocked signal as described above.

Although not necessarily timed with shots of the histogram data path, three such shots 910, 912, and 914 are illustrated in FIG. 11 as a reference. For example, interval 910 may represent a first shot, interval 912 may represent a second shot, and interval 914 may represent a third shot. Note that the integrate signal 1008 need not correspond to the start signal that would signify the beginning of a shot in the histogram data path, such as shot 910. Additionally, note that the integration register may continually be updated over time without regard to shots or measurements. In this example, the periodic signal 1012 continues to clock the ALU 1006 before, between, and after the shots 910, 912, 914 that in the histogram data path. Because the integration register 1004 may be continuously updated, the integration register may represent a total number of positive signals received from photodetectors across each of the time bins and across time intervals representing separate shots.

The top graph of FIG. 11 illustrates the value 1108 of the integration register 1004 over time. The top graph does not represent a histogram, but instead each vertical bar represents the value of the integration register 1004 at that point in time. The values from the bottom graph are also illustrated as the black boxes in the top graph that are added to the value 1108 of the integration register 1004 for each time bin. For example, the time bins in the bottom graph having values of 8, 10, 11, 9 are cumulatively added to the value 1108 in the integration register in the top graph during the corresponding time bin. When the value of 8 is stored in the histogram time bin, it is also added to the existing value 1108 in the integration register to produce an updated value of 16. Next, the current value of 10 is added to its time bin and to the existing value of 16 in the integration register to produce an upgraded value of 26, and so forth. Instead of storing an updated value in a memory location and incrementing the address of the memory, the same integration register is continuously updated with new values from the ALU 1006. As described above, the value of the integration register 1004 may be continuously increased without regard to shots being recorded in the histogram data path.

Figure 12:
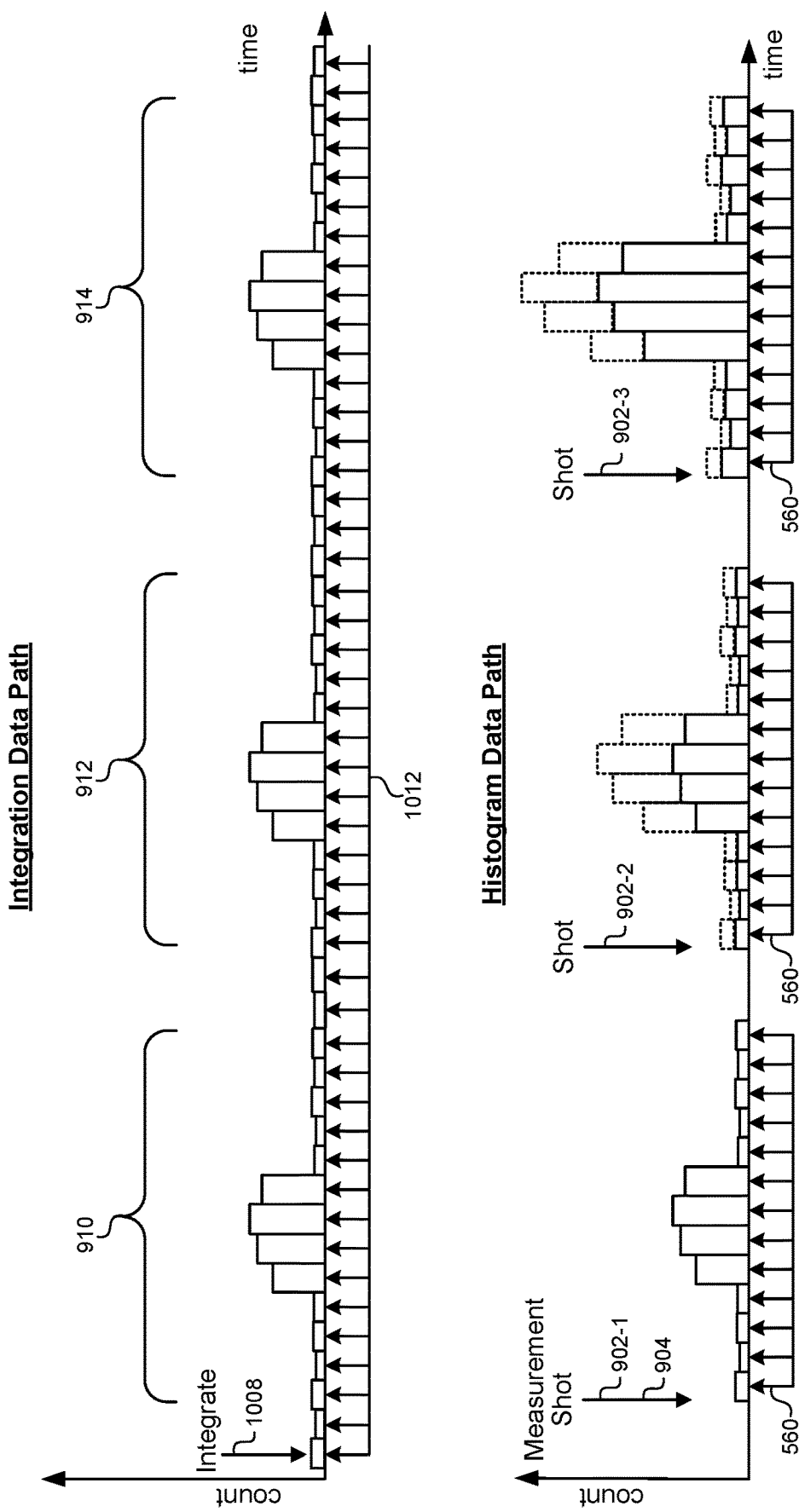
FIG. 12 illustrates timing graphs for the integration data path and the histogram data path, according to some embodiments.

FIG. 12 illustrates timing graphs for the integration data path (top) and the histogram data path (bottom), according to some embodiments. The top graph illustrates the integration data path where the periodic signal 1012 for the integration operation begins with the integrate signal 1008 and cycles continuously from that point on. The black bars on the top graph represent the values that are added to the integration register during each time bin. This can be compared to the periodic signal 560 generated in the histogram data path in the bottom graph that begins with the shot signal 902-1 and only cycles during the shot to increment the histogram values. The value in the integration register itself is not shown graphically because it grows too large to display proportionally in FIG. 12, but the values displayed in FIG. 12 as vertical bars would be added to the integration register as displayed previously in FIG. 11.

In this example, the frequency of the periodic signal 1012 for the integration data path is the same as the frequency of the periodic signal 560 of the histogram data path. In some embodiments, the two periodic signals 560, 1012 may also be phase aligned such that their rising and falling edges occur at the same time. When the phase and frequency of the two periodic signals 560, 1012 are the same, they may be implemented in the circuit as the same periodic signal such that it is shared between the ALUs 804, 1006 in the integration data path and the histogram data path. As will be discussed in greater detail below, some embodiments may share aggregation circuitry between both data paths.

Although not illustrated explicitly in FIG. 12, some embodiments may use different frequencies, phases, and/or duty cycles for each of the two periodic signals 560, 1012. This allows separate clock circuitry to govern the integration data path and the histogram data path. This also allows the integration register to collect photon counts without regard for particular shots and/or measurements in the histogram data path.

VI. Shared Aggregation Circuitry Between Data Paths

Some embodiments may divide the aggregation functions into two different stages. In each data path, a first stage may aggregate the number of positive signal counts from the photosensor. The second stage in the histogram data path may then add the number of positive signal counts to a current time bin, while the second stage in the integration data path may then add the number of positive signal counts to the integration register.

A. Two-Stage Arithmetic Functions in the Histogram Data Path

Figure 13:
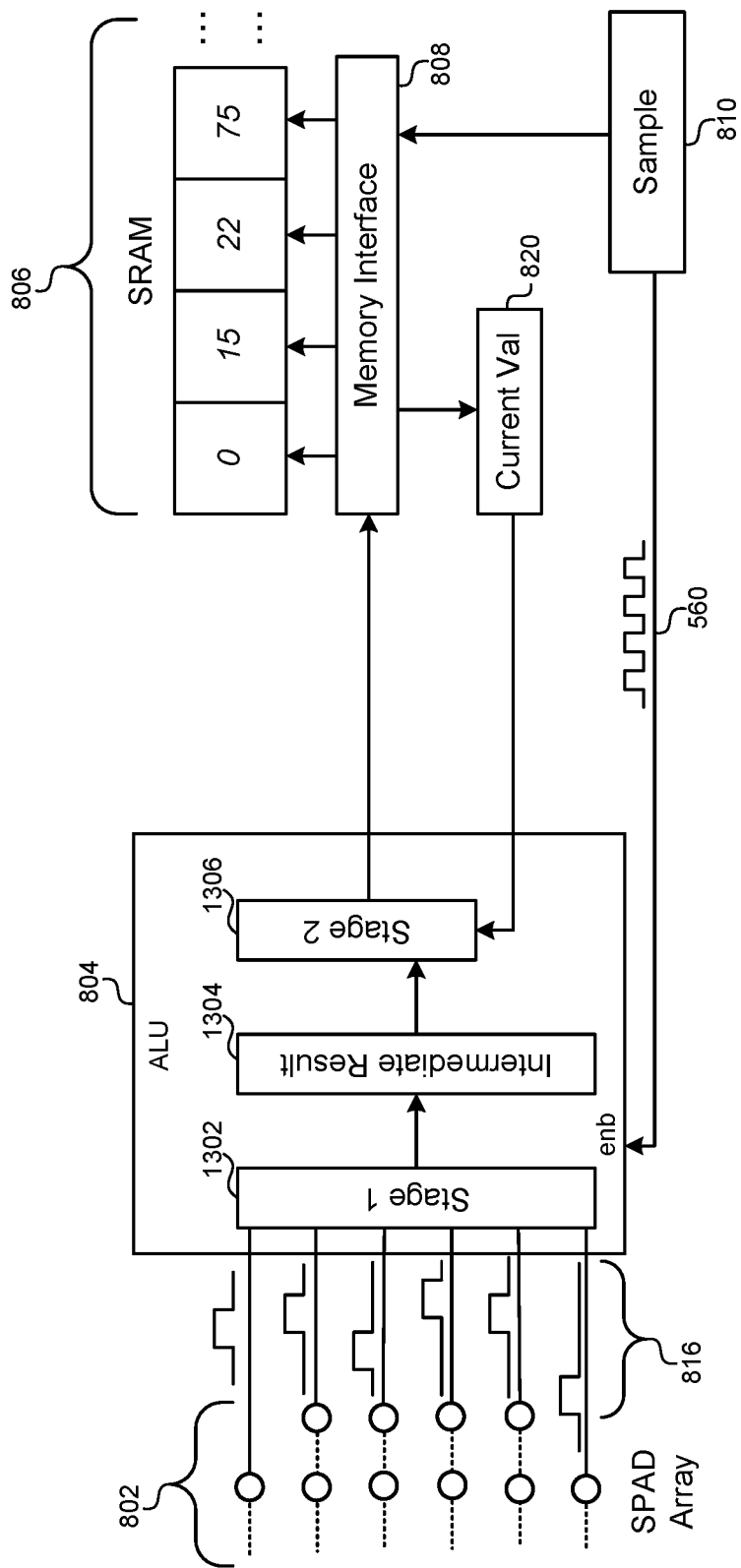
FIG. 13 shows a circuit diagram that separates the different aggregation functions in the ALU of the histogram data path, according to some embodiments.

FIG. 13 shows a circuit diagram that separates the different aggregation functions in the ALU 804 of the histogram data path, according to some embodiments. The ALU 804 need not be a specific chip or integrated circuit. Instead, the ALU 804, also referred to as an "arithmetic logic circuit" may include any circuitry that performs the aggregation functions described herein. Therefore, the ALU 804 may be distributed throughout the circuit and shared between data paths as needed.

In this embodiment, the ALU 804 includes a first stage 1302 that aggregates the positive responses from the set of signals 816 received from the photosensor 802. The first stage 1302 generates an intermediate result 1304 representing the total signal count for a current time bin. The intermediate result 1304 may then be passed to a second stage 1306. The second stage may receive a current value 820 from a current time bin of the memory 806. The second stage 1306 can then add the intermediate result 1304 to the current value 820 to generate an updated value for the current time bin in the memory 806. In some embodiments, the second stage 1306 may be integrated with the memory interface 808 instead of being part of the circuitry of an specific ALU.

B. Two-Stage Arithmetic Functions in the Integration Data Path

Figure 14:
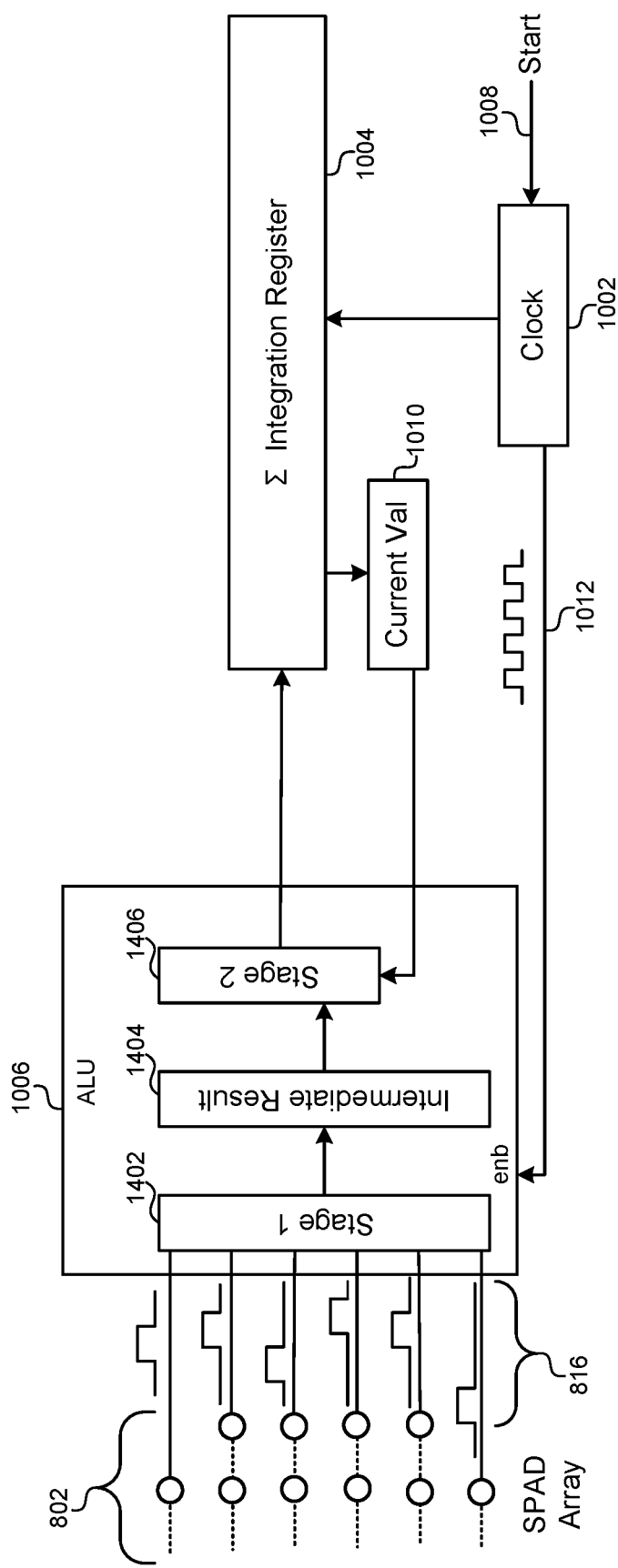
FIG. 14 shows a circuit diagram that separates the different aggregation functions in the ALU of the integration data path, according to some embodiments.

FIG. 14 shows a circuit diagram that separates the different aggregation functions in the ALU 1006 of the integration data path, according to some embodiments. This circuit diagram is similar to the circuit diagram of FIG. 13. However, instead of reading a current value from the histogram memory 806, the current value 1010 is read from the current value stored in the integration register 1004. This can be combined with the intermediate result 1404 received from the first stage 1402 of the ALU 1006 representing the total signal count from the photosensor 802. The output of the second stage 1406 can then be stored back in the integration register 1404. In some embodiments, the second stage 1406 can be implemented as part of the circuitry for the integration register.

The first stage 1302 of the ALU 804 of the histogram data path performs essentially the same function as the first stage 1402 of the ALU 1006 of the integration data path. Therefore, the intermediate result 1304 of the histogram data path may be essentially the same as the intermediate result 1404 of the integration data path. Stated another way, the first stage of both aggregation functions generates a total signal count for the same photosensor 802 and time bin. If the periodic signal 560 of the histogram data path is the same as the periodic signal 1012 of the integration data path, then the time bins used for each of the two data paths will also be the same. In this case, both data paths may share a portion of the aggregation circuitry. This may save space on an integrated circuit die on which these two data paths are implemented.

C. Shared Arithmetic Functions Between Data Path

Figure 15:
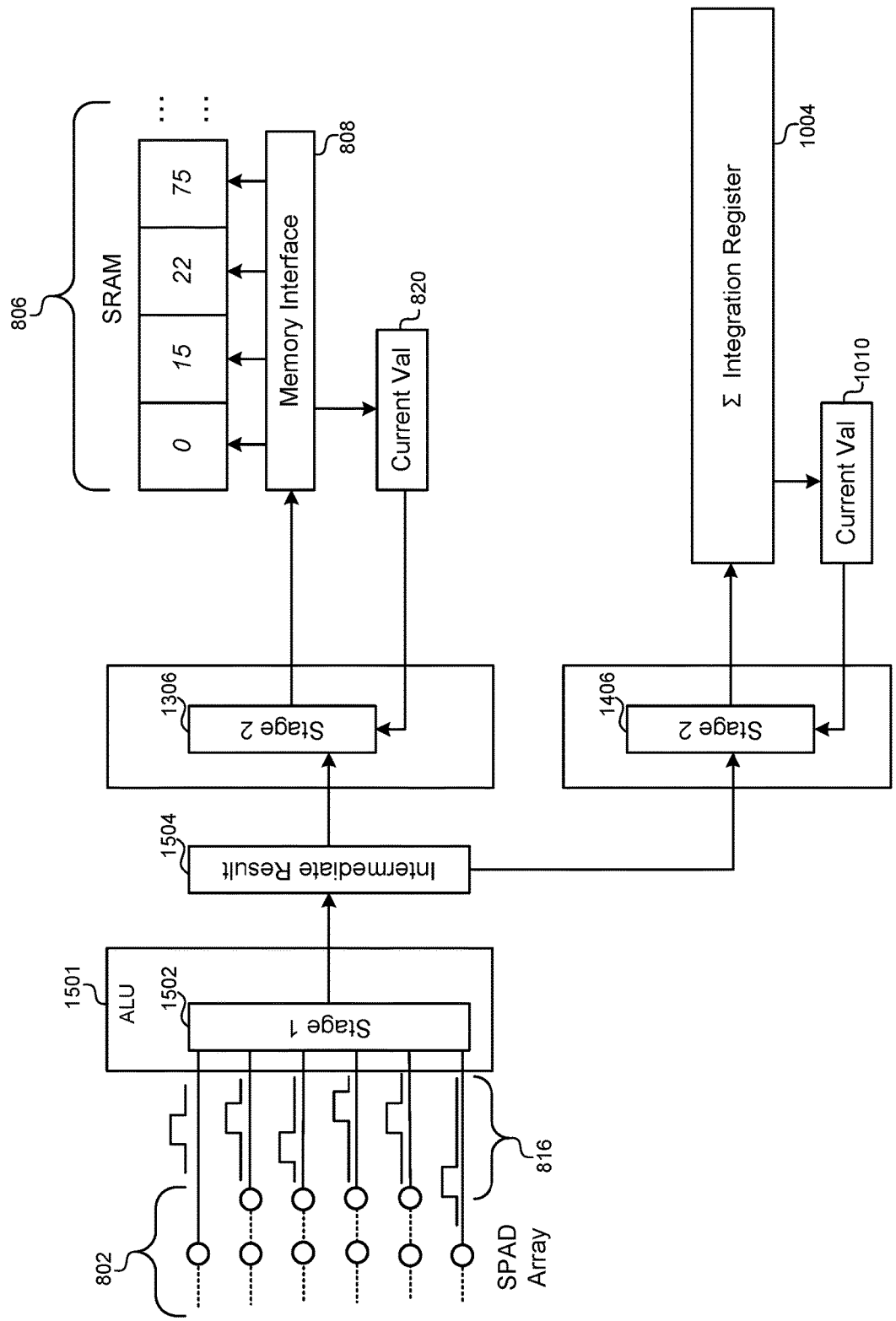
FIG. 15 illustrates shared aggregation circuitry between the two data paths, according to some embodiments.

FIG. 15 illustrates shared aggregation circuitry between the two data paths, according to some embodiments. A single ALU 1501 can implement a first aggregation stage 1502 that sums the total signal count from the photodetectors of the photosensor 802. This first stage 1502 can generate an intermediate result 1504 that is then passed to each of the two data paths. For example, the intermediate result 1504 can be passed to the second stage 1306 of the histogram data path. This second stage 1306 can add the common intermediate result 1504 to the current value 820 for a current time bin in the memory 806 representing the histogram. The updated value can then be stored back in the current time bin in the memory 806. Similarly, the common intermediate result 1504 can be passed to the second stage 1406 of the integration data path. This second stage 1406 can add the intermediate result 1504 to the current value 1010 of the integration register 1004. This updated value can then be stored back in the integration register 1004.

When the first stage 1502 of the ALU 1501 is shared between both data paths, a periodic signal that clocks the ALU 1501 may also be shared between both data paths. Consequently, the size of the time bins in the integration data path and the size of the time bins in the histogram data path may be the same. However, even though the time bins may be the same size, the overall integration cycle in the integration data path may run continuously and still be independently controlled when compared to the histogram data path. For example, the memory 806 in the histogram data path may only store and update memory locations during pulse train measurements in a shot, while the integration register 1004 may continuously update its current value 1010 regardless of whether or not a shot is active in the histogram data path.

The example of FIG. 15 illustrates how the different aggregation functions used by both data paths can be shared or separated between the two data paths. Therefore, any recitation of an arithmetic logic circuit may encompass any aggregation function in either data path whether implemented as separate stages or as a single stage.

FIG. 15 illustrates the histogram data path and the integration data path implemented together in the same circuit. For example, both data paths can be implanted in parallel on the same die of an integrated circuit. Both data paths may share the same photosensor 802, and the positive signals from the photosensor 802 may propagate through each data path simultaneously in parallel. Both data paths may share one or more periodic signals that, for example, cause the integration register 104 to be updated and/or a current time bin in the memory 806 to be updated. Alternatively, both data paths may be implemented in parallel while using independent periodic signals such that the integration register 1004 and the memory 806 are updated independent of each other.

Although this example shows the parallel data paths implemented together and sharing circuitry of the first stage 1502 of the ALU 1501, other embodiments may still be implemented in parallel without sharing circuitry in this manner. For example, the histogram data path of FIG. 13 may be implemented in parallel with the integration data path of FIG. 14 without sharing any stages of any aggregation functions or arithmetic logic circuits. These separate data paths may share periodic signals and be updated in parallel, or they may use independent periodic signals and be updated independent from each other. Therefore, FIG. 15 may be altered to show both data paths with independent ALUs that are not shared between the two data paths.

Although the examples of FIGS. 13-15 illustrate parallel data paths for a single photosensor 802, some embodiments may include copies of both data paths for each photosensor in a photosensor array. Thus, the operations performed by these parallel data paths may be performed in parallel for a large number of pixels at once. The histogram and integration functions may therefore be considered per-pixel functions that are carried out in parallel, for example, in an integrated circuit for each pixel. Each pixel may include a histogram data path and an integration data path, and each of these data paths may share circuitry and/or periodic signals, or may be entirely independent of each other as described above.

VII. Using the Integration Register

The value stored in the integration register can be used for various purposes. For example, the value in the integration register can be used to characterize an overall amount of light received by the optical measurement system. It can be used for diagnostic purposes and for evaluating the LIDAR equipment. It can be used to generate images of the environment surrounding the optical measurement system. The value of the integration register may be used to characterize an amount of ambient light or background noise during optical measurements. This background noise can then be removed from the signal peaks of interest to generate clean signal profiles. The background noise level can also be used to set a detection threshold that is above the background noise level to avoid false positives.

A. Estimating Ambient Background Noise

Figure 16:
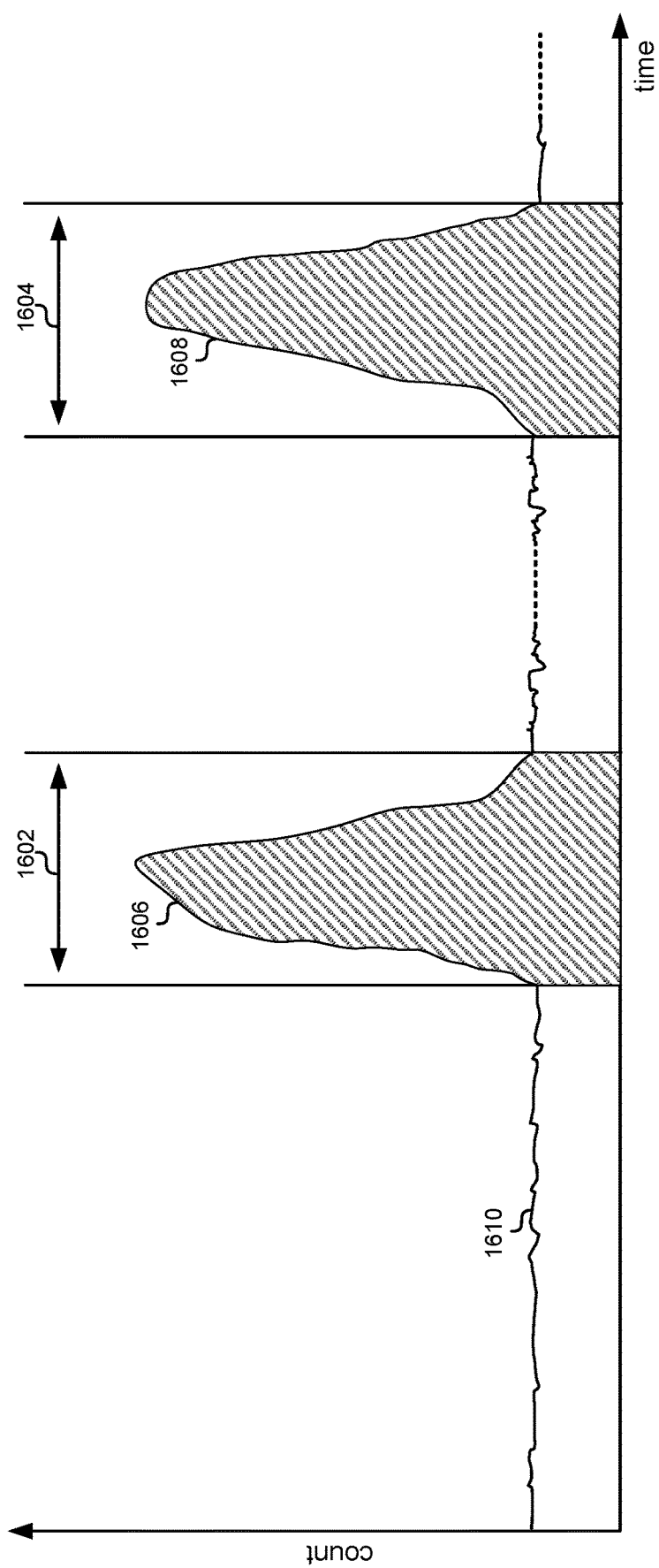
FIG. 16 shows a graph of light received at the optical measurement system resulting from a plurality of shots, according to some embodiments.

FIG. 16 shows a graph of light detected at the optical measurement system resulting from a plurality of shots, according to some embodiments. Each of the shots may include a pulse train having at least two pulses, such as pulse 1606 and pulse 1608. The vertical axis of the graph represents the photon count received by one photosensor in an array of photosensors. The horizontal axis represents time. These photons may have been received over a plurality of shots and thus a digitized representation of the signals illustrated in the graph may be stored in a histogram in the SRAM memory. Note that the actual values in the memory would be discrete values divided into time bins as illustrated in FIG. 6. However, these values are illustrated as raw signals in FIG. 16 for clarity.

The data illustrated in the graph and stored in the histogram can be used to estimate the ambient background noise level in the measurement. As described above, filter and thresholding operations can be performed on the histogram data to identify time windows during which the pulses 606, 608 occur. In this example, time window 1602 and time window 1604 may be identified as including histogram time bins during which the reflected signals for the pulses 1606, 1608 are received. The ambient noise level could be estimated using a standard deviation analysis of the histogram data. Alternatively, samples could be taken of histogram values outside of the pulse time windows 1602, 1604 as an estimate of the background noise. However, both of these methods may not be entirely accurate due to the effect of noise and transients that were not identified as return pulses.

The total value stored in the integration register provides a more accurate and computationally inexpensive method of estimating the background noise in the measurement. Because the integration register stores an overall total of all photons received by the photosensor over a known time interval, this value can be divided by the total time interval during which the integration operation took place to estimate the background noise. Note that FIG. 16 is not drawn to scale with respect to time. Actual return pulses generally make up only a small fraction of the overall integration value recorded in the integration register. Therefore, the photons received due to the return pulses may be considered negligible compared to the overall number of photons received due to background noise throughout the measurement. The extent to which the photons in the return pulses affect the estimation of background noise may depend on the size of the time windows 1602, 1604 compared to the overall integration time. If the size of the time windows 1602, 1604 is small compared to the overall integration time (e.g., less than 5%) then their effect on the background noise estimation may be considered negligible, and the total signal photon count may be used to estimate background ambient light.

However, if the size of the time windows 1602, 1604 makes up more than a negligible portion of the total integration time, then additional steps may be taken to more accurately estimate the ambient background noise. For example, the photons received during the time windows 1602, 1604 can be subtracted from the value in the integration register. Additionally, the length of the time windows 1602, 1604 can be subtracted from the overall integration time. The modified integration register value can then be divided by the modified integration time to better estimate the background noise value. In this way, the optical measurement system can exclude signals received from the photosensor during a return pulse when estimating the ambient background noise.

B. Setting a Detection Threshold

Figure 17:
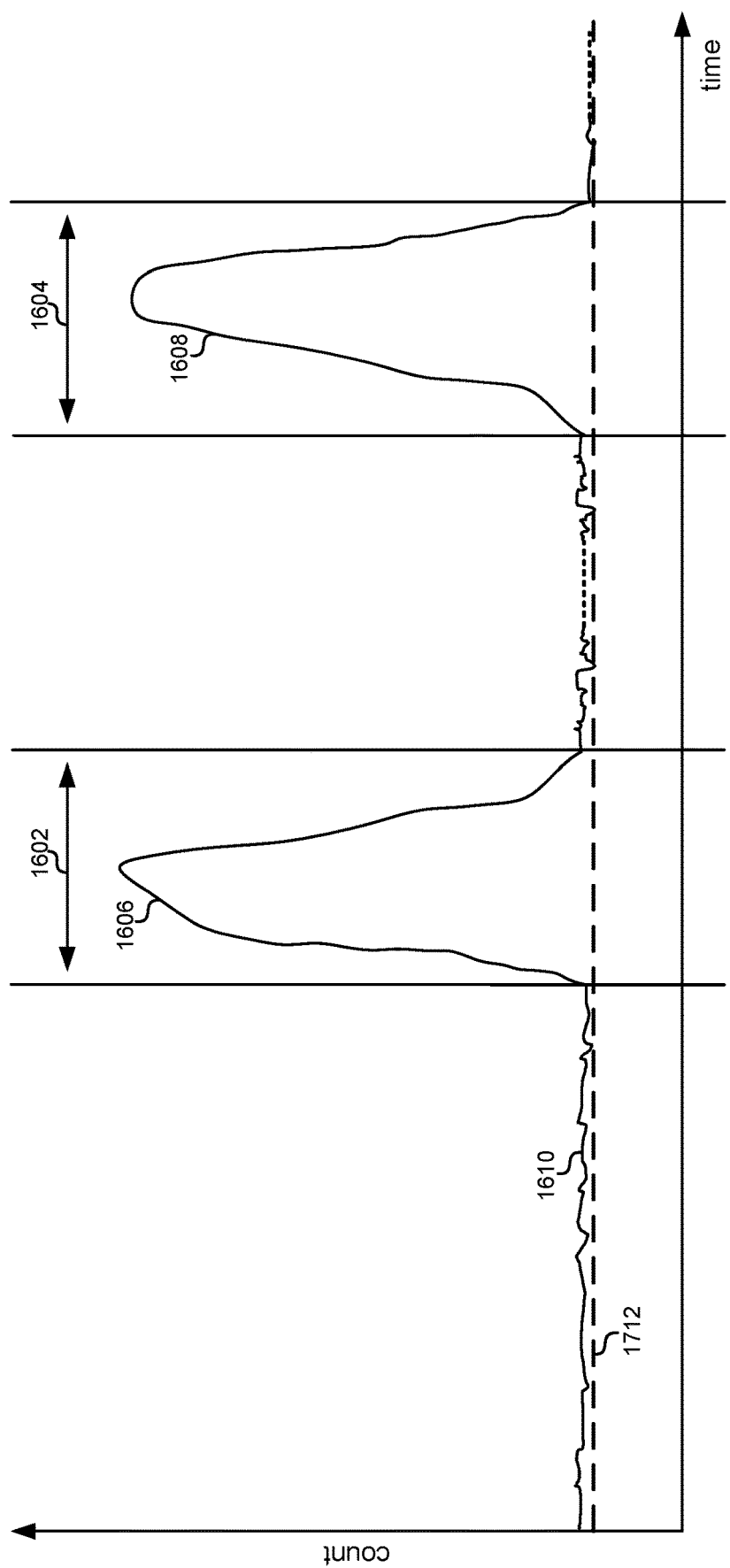
FIG. 17 illustrates the estimated background noise compared to the received photon count, according to some embodiments.

FIG. 17 illustrates the estimated background noise compared to the received photon count, according to some embodiments. Using the process described above, an estimated background noise level 1712 has been calculated for the measurement. In this case, the photon count during the time windows 1602, 1604 was removed from the estimation procedure by subtracting the photon counts received during the time windows 1602, 1604 as described in the section above. This results in an estimated background noise level 1712 that is very close to the actual average background noise level 1610.

The estimated background noise level 1712 can be used for a number of different signal processing procedures by the optical measurement system. In some embodiments, the estimated background noise level 1712 can be subtracted from each of the pulse signals 1606, 1608 before they are analyzed for distance measurements. In some implementations, an integrated circuit may include the integration and/or histogram data paths described above. This integrated circuit may be used to identify pulse locations before passing that information off the integrated circuit to a processor for distance calculations, data visualization, and so forth. Additionally, some implementations may pass information regarding the signal strength of the pulses 1606, 1608 themselves, and the strength (i.e., magnitude) of these pulses can be used in addition to their temporal location.

Before passing the pulse data from the integrated circuit, the estimated background noise level 1712 can be used as a signal floor and subtracted from the pulses 1606, 1608. This provides a more accurate characterization of the pulse magnitude by removing the ambient background noise before the shape and/or height of those pulses 1606, 1608 are analyzed.

Figure 18:
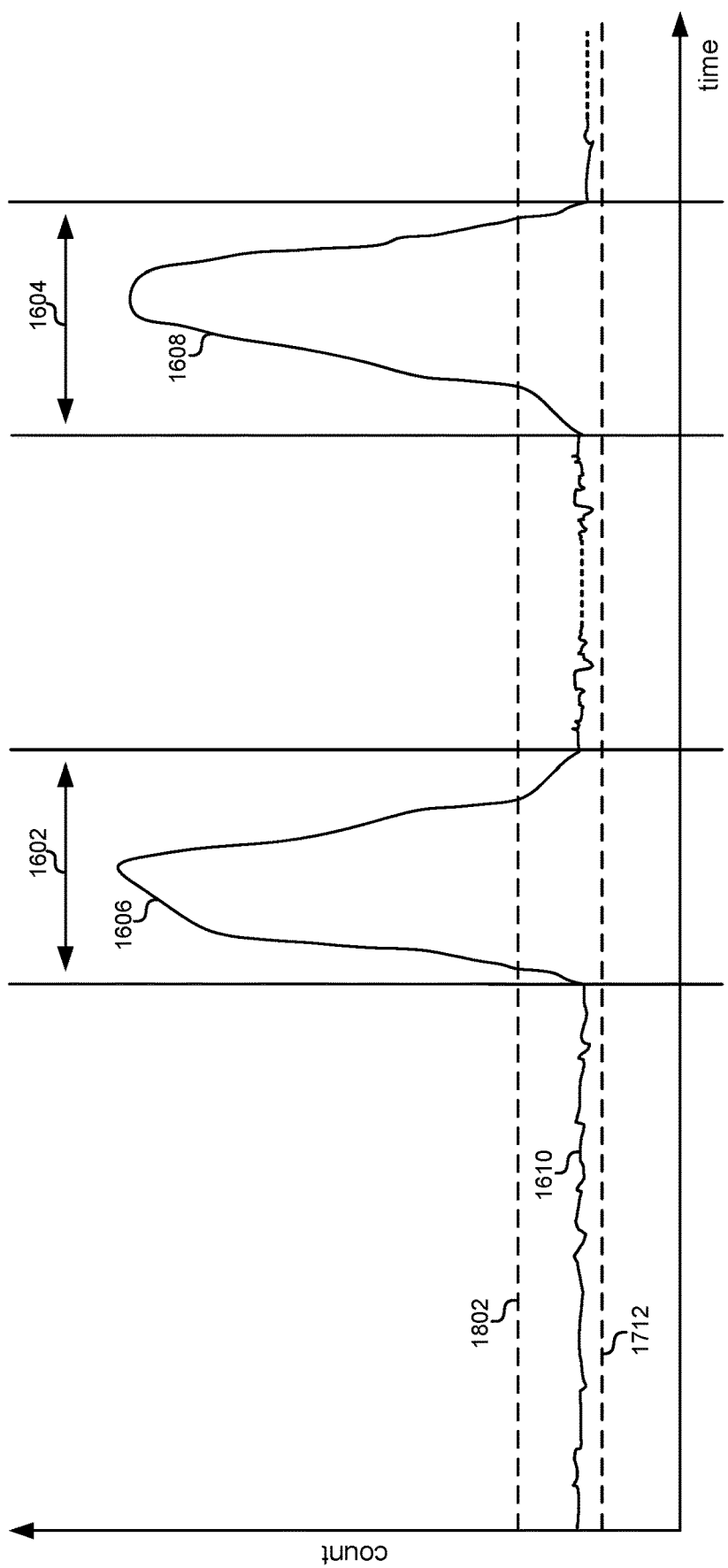
FIG. 18 illustrates how the estimated background noise can be used to set a signal threshold for detecting return pulses, according to some embodiments.

FIG. 18 illustrates how the estimated background noise can be used to set a signal threshold for detecting return pulses, according to some embodiments. After estimating the background noise level 1712, that estimation may be used as a baseline for setting a threshold 1802 for detecting the return pulses 1606, 1608. For example, some embodiments may take the estimated background noise level 1712 and add a predetermined percentage to the background noise level 1712 to calculate the desired threshold 1802. The predetermined percentage by which the estimated background noise level 1712 may be increased may be 10%, 20%, 30%, 40%, 50%, 75%, 100%, 125%, 150%, and so forth.

The threshold 1802 may be used for a current and/or subsequent measurement. After all shots have been completed for a measurement, the estimated background noise level 712 may be computed as described above and used to set the threshold 1802. Some embodiments may then identify a predetermined number of the strongest pulses in the receive return signal. The threshold 1802 can then be used to identify which pulses out of the strongest return pulses in the current measurement should be identified as return pulses 1606, 1608. The estimated background noise level 1712 may then be subtracted from the pulses 1606, 1608 before they are further processed. The threshold 1802 can then be used by a subsequent measurement to initially identify pulses in the subsequent measurement and remove those pulses from a subsequent estimated background noise calculation. The subsequent estimated background noise calculation in the subsequent measurement can then be used to identify pulses in that measurement with greater accuracy.

VIII. Method for Using an Optical Measurement System

Figure 19:
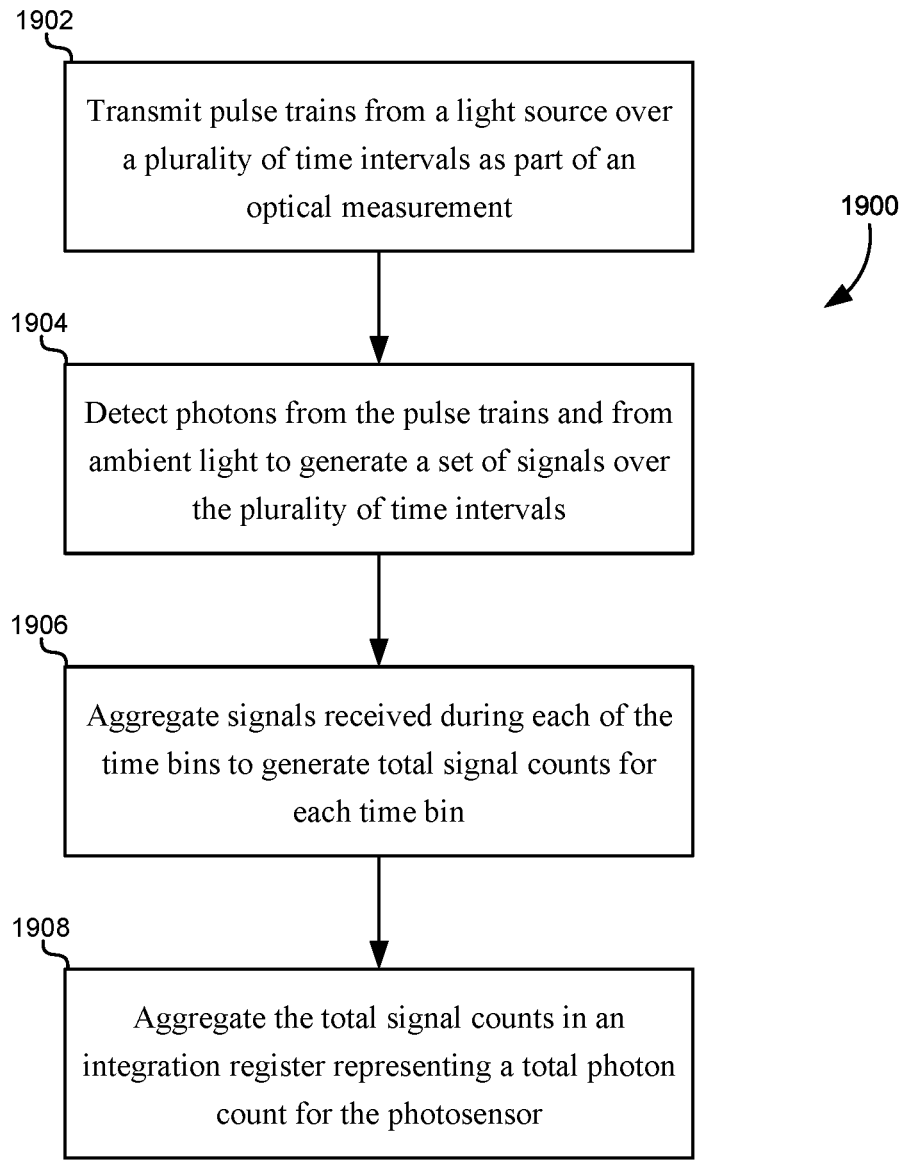
FIG. 19 shows a flowchart 1900 of a method of using an optical measurement system, according to some embodiments.

FIG. 19 shows a flowchart 1900 of a method of using an optical measurement system, according to some embodiments.

At block, 1902, the method may include transmitting N pulse trains from a light source over a plurality of time intervals as part of an optical measurement. Each of the pulse trains may include one or more pulses from the light source, and each of the pulse trains may correspond to a different time interval that is triggered by a start signal. The time interval may represent a single shot, and the N pulse trains may represent a measurement comprising a plurality of shots. The value of "N" may be an integer value greater than or equal to one (e.g., one, two, three, four, five, etc.).

At block 1904, the method may also include detecting photons of the N pulse trains and photons from ambient light using photodetectors of the photosensor. The photodetectors may be implemented by SPADs, and may generate a plurality of signals over the plurality of time intervals for each of the SPADs. A signal from the photodetector indicates whether photons were detected during a time bin in the current time interval. As described above, each time interval may be subdivided into a plurality of time bins that correspond to a frequency with which the ALU aggregates photon counts and updates values in a histogram and/or integration register.

At block 1906, the method may additionally include receiving the set of signals from the photodetectors and aggregating a number of signals in the set of positive signals that indicate a detection of a photon in each of a plurality of time bins in each of the plurality of time intervals. An arithmetic logic circuit may receive positive signals from any number of the photodetectors in the photosensor and aggregate the positive signals to generate a total signal count for that photosensor received during the time bin. The length of the time bin may be dependent on the frequency of a periodic signal that is provided to the arithmetic logic circuit. The periodic signal may also be used to clock the ALU such that positive signals are not missed or double-counted.

At block 1908, the method may further include aggregating each of the total signal counts in an integration register. The integration register may represent a total number of positive signals received from the photodetectors across each of the time bins in at least the plurality of time intervals. Note that these time bins for the integration data path may be defined by an enable signal that is specific to the integration register. Thus, these time bins may be different and independent from time bins used by the histogram data path, which may be defined by a separate and independent enable or shot signal. This may correspond to a total photon count for the photosensor. This aggregation of total signal counts may include some or all of the signals received in the plurality of time bins, regardless of whether those time bins correspond to a shot or pulse train in the histogram data path. The integration register may provide a current value to an arithmetic logic circuit, which can add the current value to the total positive signal count from the photosensor during the time bin. Latching a new value into the integration register may be based on the periodic signal that is used to derive the length of the time bin and aggregate the total positive signal count for the photosensor.

IX. Additional Embodiments

While some embodiments disclosed herein have focused on the application of light ranging within the context of 3D sensing for automotive use cases, systems disclosed herein can be used in any application without departing from the scope of the present disclosure. For example, systems can have a small, or even miniature, form factors that enable a number of additional use cases, e.g., for solid-state light ranging systems. For example, systems can be used in 3D cameras and/or depth sensors within devices, such as mobile phones, tablet PCs, laptops, desktop PCs, or within other peripherals and/or user-interface devices. For example, one or more embodiments could be employed within a mobile device to support facial recognition and facial tracking capabilities, eye tracking capabilities, and/or for 3D scanning of objects.

Other use cases include forward-facing depth cameras for augmented and virtual reality applications in mobile devices.

Other applications include deployment of one or more systems on airborne vehicles, such as airplanes, helicopters, drones, and the like. Such examples could provide 3D sensing and depth imaging to assist with navigation (autonomous or otherwise) and/or to generate 3D maps for later analysis, e.g., to support geophysical, architectural, and/or archeological analyses.

Systems can also be mounted to stationary objects and structures, such as buildings, walls, poles, bridges, scaffolding, and the like. In such cases, the systems can be used to monitor outdoor areas, such as manufacturing facilities, assembly lines, industrial facilities, construction sites, excavation sites, roadways, railways, bridges, etc. Furthermore, systems can be mounted indoors and used to monitor movement of persons and or objects within a building, such as the movement of inventory within a warehouse or the movement of people, luggage, or goods within an office building, airport, train station, etc. As would be appreciated by one of ordinary skill in the art with the benefit of this disclosure, many different applications of light ranging systems are possible and, as such, the examples provided herein are provided for illustrative purposes only and shall not be construed to limit the uses of such systems to only the examples explicitly disclosed.

X. Computer System

Any of the computer systems or circuits mentioned herein may utilize any suitable number of subsystems. The subsystems can be connected via a system bus 75. As examples, subsystems can include input/output (I/O) devices, system memory, storage device(s), and network adapter(s) (e.g. Ethernet, Wi-Fi, etc.), which can be used to connect a computer system other devices (e.g., an engine control unit). System memory and/or storage device(s) may embody a computer readable medium.

A computer system can include a plurality of the same components or subsystems, e.g., connected together by external interface, by an internal interface, or via removable storage devices that can be connected and removed from one component to another component. In some embodiments, computer systems, subsystem, or apparatuses can communicate over a network.

Aspects of embodiments can be implemented in the form of control logic using hardware circuitry (e.g. an application specific integrated circuit or field programmable gate array) and/or using computer software with a generally programmable processor in a modular or integrated manner. As used herein, a processor can include a single-core processor, multi-core processor on a same integrated chip, or multiple processing units on a single circuit board or networked, as well as dedicated hardware. Based on the disclosure and teachings provided herein, a person of ordinary skill in the art will know and appreciate other ways and/or methods to implement embodiments of the present invention using hardware and a combination of hardware and software.

Any of the software components or functions described in this application may be implemented as software code to be executed by a processor using any suitable computer language such as, for example, Java, C, C++, C #, Objective-C, Swift, or scripting language such as Perl or Python using, for example, conventional or object-oriented techniques. The software code may be stored as a series of instructions or commands on a computer readable medium for storage and/or transmission. A suitable non-transitory computer readable medium can include random access memory (RAM), a read only memory (ROM), a magnetic medium such as a hard-drive or a floppy disk, or an optical medium such as a compact disk (CD) or DVD (digital versatile disk), flash memory, and the like. The computer readable medium may be any combination of such storage or transmission devices.

Such programs may also be encoded and transmitted using carrier signals adapted for transmission via wired, optical, and/or wireless networks conforming to a variety of protocols, including the Internet. As such, a computer readable medium may be created using a data signal encoded with such programs. Computer readable media encoded with the program code may be packaged with a compatible device or provided separately from other devices (e.g., via Internet download). Any such computer readable medium may reside on or within a single computer product (e.g. a hard drive, a CD, or an entire computer system), and may be present on or within different computer products within a system or network. A computer system may include a monitor, printer, or other suitable display for providing any of the results mentioned herein to a user.

Any of the methods described herein may be totally or partially performed with a computer system including one or more processors, which can be configured to perform the steps. Thus, embodiments can be directed to computer systems configured to perform the steps of any of the methods described herein, potentially with different components performing a respective step or a respective group of steps. Although presented as numbered steps, steps of methods herein can be performed at a same time or at different times or in a different order. Additionally, portions of these steps may be used with portions of other steps from other methods. Also, all or portions of a step may be optional. Additionally, any of the steps of any of the methods can be performed with modules, units, circuits, or other means of a system for performing these steps.

The specific details of particular embodiments may be combined in any suitable manner without departing from the spirit and scope of embodiments of the invention. However, other embodiments of the invention may be directed to specific embodiments relating to each individual aspect, or specific combinations of these individual aspects.

The above description of example embodiments of the invention has been presented for the purposes of illustration and description. It is not intended to be exhaustive or to limit the invention to the precise form described, and many modifications and variations are possible in light of the teaching above.

A recitation of "a", "an" or "the" is intended to mean "one or more" unless specifically indicated to the contrary. The use of "or" is intended to mean an "inclusive or," and not an "exclusive or" unless specifically indicated to the contrary. Reference to a "first" component does not necessarily require that a second component be provided. Moreover reference to a "first" or a "second" component does not limit the referenced component to a particular location unless expressly stated. The term "based on" is intended to mean "based at least in part on."

All patents, patent applications, publications, and descriptions mentioned herein are incorporated by reference in their entirety for all purposes. None is admitted to be prior art.

What is claimed is:

1. A method of using an optical measurement system, the method comprising:
transmitting N pulse trains from a light source over a plurality of time intervals as part of an optical measurement, wherein each of the N pulse trains includes one or more pulses from the light source and corresponds to a different time interval that is triggered by a start signal, and wherein N is an integer greater than or equal to one;
detecting photons of the N pulse trains and photons from ambient light using one or more photodetectors of a photosensor of the optical measurement system, thereby generating a plurality of signals over the plurality of time intervals for each of the one or more photodetectors, wherein a signal from a photodetector indicates whether a photon was detected during a time bin of a time interval;

during each of a plurality of time bins in each of the plurality of time intervals:

receiving, at an arithmetic logic circuit, a set of signals from the one or more photodetectors; and aggregating a number of positive signals in the set of signals that indicate a detection of a photon, thereby generating a total signal count for the time bin;

aggregating the total signal counts in an integration register to obtain a total photon count for the photosensor, such that the total photon count represents a total number of positive signals received from the one or more photodetectors across at least the plurality of time bins in the plurality of time intervals, and wherein each of the plurality of time bins recurs in each of the plurality of time intervals, the method further comprising:

for each of the plurality of time bins:

aggregating the total signal counts across the plurality of time intervals to obtain a total bin count for the time bin; and storing the total bin count in a memory that represents a histogram, wherein each of the total bin counts is stored in an individual location in the memory.

2. The method of claim 1, further comprising:

using the total photon count in the integration register to estimate a background noise detected by the optical measurement system.

3. The method of claim 2, wherein using the total photon count in the integration register to estimate a background noise comprises:

dividing the total photon count by a duration of time during which the integration register was enabled.

4. The method of claim 3, wherein the duration of time during which the integration register was enabled is determined based on a total number of the plurality of time bins or a total number of clock cycles during which the integration register was enabled.

5. The method of claim 2, wherein using the total photon count in the integration register to estimate a background noise comprises:

identifying one or more time bins in the plurality of time bins during which reflected signals resulting from the N pulse trains are estimated to have been received by the optical measurement system; and excluding signals in the plurality of signals received during the one or more time bins from the total photon count in the integration register.

6. The method of claim 5, further comprising removing the background noise from the reflected signals.

7. The method of claim 6, wherein removing the background noise from the reflected signals comprises:

subtracting the background noise from the signals received during the one or more time bins.

8. The method of claim 5, further comprising determining a threshold for detecting signals as corresponding to a reflection of pulses of the N pulse trains from an object, such that the threshold is higher than the background noise.

9. The method of claim 8, wherein determining the threshold for detecting the reflected signals comprises:

multiplying the background noise by a predetermined percentage to calculate the threshold.

10. The method of claim 1, wherein the integration register is clocked independently from the memory that represents the histogram.

11. The method of claim 1, wherein the one or more photodetectors comprise single-photon avalanche diodes (SPADs).

12. An optical measurement system comprising:

a light source configured to transmit N pulse trains over a plurality of time intervals as part of an optical measurement, wherein each of the N pulse trains includes one or more pulses from the light source and corresponds to a different time interval that is triggered by a start signal, and wherein N is an integer greater than or equal to one;

a photosensor comprising one or more photodetectors configured to detect photons of the N pulse trains and photons from ambient light and to generate a plurality of signals over the plurality of time intervals for each of the one or more photodetectors, wherein a signal from a photodetector indicates whether a photon was detected during a time bin of a time interval;

an arithmetic logic circuit configured to receive, for each of a plurality of time bins in each of the plurality of time intervals, a set of signals from the one or more photodetectors and to aggregate a number of positive signals in the set of signals that indicate a detection of a photon, thereby generating a total signal count for the time bin;

an integration register configured to store an aggregation of the total signal counts to obtain a total photon count for the photosensor, such that the total photon count represents a total number of positive signals received from the one or more photodetectors across at least the plurality of time bins in the plurality of time intervals, and wherein each of the plurality of time bins recurs in each of the plurality of time intervals, and for each of the plurality of time bins, the integration register is further configured to:

store an aggregation of the total signal counts across the plurality of time intervals to as a total bin count for the time bin; and store the total bin count in a memory that represents a histogram, wherein each of the total bin counts is stored in an individual location in the memory.

13. The optical measurement system of claim 12, wherein the plurality of signals from the one or more photodetectors comprise binary signals.

14. The optical measurement system of claim 12, further comprising a periodic signal that causes the arithmetic logic circuit to aggregate the signals received during each of the plurality of time bins.

15. The optical measurement system of claim 14, further comprising a memory that represents a histogram of respective photon counts for each of the plurality of time bins across the plurality of time intervals.

16. The optical measurement system of claim 15, wherein the periodic signal is shared between the memory and the integration register.

17. The optical measurement system of claim 15, wherein the integration register is clocked using the periodic signal, and the memory that represents a histogram is clocked using a different periodic signal.

18. The optical measurement system of claim 12, wherein the arithmetic logic circuit and the integration register are part of a single integrated circuit.

19. The optical measurement system of claim 12, wherein the arithmetic logic circuit comprises:

a first stage configured to aggregate, for each of a plurality of time bins in the plurality of time intervals, the number of positive signals in the set of signals received for the time bin; and a second stage configured to aggregate the total signal counts for each of the plurality of time bins in each of the plurality of time intervals.

20. The optical measurement system of claim 19, wherein the first stage of the arithmetic logic circuit is shared between the integration register and a memory that represents a histogram of respective photon counts for each of the plurality of time bins across the plurality of time intervals.

21. The optical measurement system of claim 12, further comprising a plurality of photosensors that each correspond to different fields of view, each of the plurality of photosensors comprising a plurality of photodetectors, an arithmetic logic circuit, and an integration register.

* * * * *